(12) United States Patent
Matsuda et al.

(10) Patent No.: US 8,174,339 B2
(45) Date of Patent: May 8, 2012

(54) DUPLEXER, SUBSTRATE FOR DUPLEXER, AND ELECTRONIC APPARATUS

(75) Inventors: Takashi Matsuda, Kawasaki (JP); Kazunori Inoue, Kawasaki (JP); Shogo Inoue, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 324 days.

(21) Appl. No.: 12/564,648

(22) Filed: Sep. 22, 2009

(65) Prior Publication Data

US 2010/0244979 A1    Sep. 30, 2010

(30) Foreign Application Priority Data

Dec. 26, 2008   (JP) ................... 2008-332671

(51) Int. Cl.
*H01P 5/12*     (2006.01)
*H04B 1/50*     (2006.01)
*H03H 9/70*     (2006.01)

(52) U.S. Cl. ........ 333/126; 333/129; 333/132; 333/133; 455/82

(58) Field of Classification Search .......... 333/100, 333/110, 124–129, 132–136; 455/78, 82, 455/83
See application file for complete search history.

(56) References Cited

U.S. PATENT DOCUMENTS

| | | | |
|---|---|---|---|
| 4,247,836 A | | 1/1981 | Redwood et al. |
| 4,931,755 A | * | 6/1990 | Sakamoto et al. ............ 333/193 |
| RE37,639 E | * | 4/2002 | Ehara et al. .................. 333/193 |
| 6,472,959 B1 | * | 10/2002 | Beaudin et al. ............... 333/193 |
| 6,525,624 B1 | | 2/2003 | Hikita et al. |
| 6,566,981 B2 | | 5/2003 | Urabe et al. |
| 6,759,924 B2 | | 7/2004 | Sakuragawa et al. |
| 6,917,258 B2 | | 7/2005 | Kushitani et al. |
| 6,940,368 B2 | | 9/2005 | Plessky et al. |
| 6,972,644 B2 | | 12/2005 | Nishizawa et al. |
| 7,030,716 B2 | | 4/2006 | Tsutsumi et al. |
| 7,154,359 B2 | | 12/2006 | Inoue et al. |

(Continued)

FOREIGN PATENT DOCUMENTS

EP    1 480 337 A1    11/2004

(Continued)

OTHER PUBLICATIONS

International Search Report (ISR) issued in PCT/JP2008/073752 mailed in Mar. 2009

(Continued)

*Primary Examiner* — Barbara Summons
(74) *Attorney, Agent, or Firm* — Chen Yoshimura LLP

(57) ABSTRACT

A duplexer includes a transmit filter connected between a common terminal and a transmission terminal, a receive filter connected between the common terminal and a reception terminal, a capacitor connected in parallel with one of the transmit filter and the receive filter and provided between two terminals of the common terminal, the transmission terminal, and the reception terminal, and a package. The package includes an insulating layer, foot pads that include the common terminal, the transmission terminal and the reception terminal and are formed on one surface of the insulating layer, and interconnections formed on another surface opposite to the one surface of the insulating layer. The capacitor is composed of two capacitor forming units that are connected in parallel with each other and are formed with at least one foot pad of the foot pads and two of the interconnections that overlap with two opposing sides of the at least one food pad respectively.

15 Claims, 21 Drawing Sheets

U.S. PATENT DOCUMENTS

| | | |
|---|---|---|
| 7,164,306 B2 | 1/2007 | Makino |
| 7,479,850 B2 | 1/2009 | Kearns et al. |
| 7,554,419 B2 | 6/2009 | Inoue et al. |
| 2001/0043024 A1 | 11/2001 | Takamine et al. |
| 2002/0014121 A1 | 2/2002 | Urabe et al. |
| 2002/0158708 A1* | 10/2002 | Inoue et al. .................... 333/133 |
| 2003/0112768 A1 | 6/2003 | Frank |
| 2004/0070469 A1 | 4/2004 | Plessky et al. |
| 2004/0219888 A1* | 11/2004 | Iwamoto et al. ................. 455/76 |
| 2004/0233019 A1* | 11/2004 | Inoue et al. .................... 333/193 |
| 2005/0046520 A1 | 3/2005 | Nishizawa et al. |
| 2005/0281210 A1 | 12/2005 | Makino |
| 2006/0091977 A1 | 5/2006 | Inoue et al. |
| 2007/0001786 A1* | 1/2007 | Kundu .......................... 333/204 |
| 2007/0268092 A1 | 11/2007 | Inoue et al. |
| 2008/0007370 A1* | 1/2008 | Matsumoto .................... 333/194 |
| 2009/0058557 A1 | 3/2009 | Tsurunari et al. |
| 2009/0273408 A1 | 11/2009 | Inoue et al. |
| 2010/0026414 A1* | 2/2010 | Iwaki et al. .................... 333/100 |
| 2010/0026419 A1* | 2/2010 | Hara et al. .................... 333/175 |
| 2010/0109800 A1 | 5/2010 | Ueda et al. |
| 2010/0150075 A1* | 6/2010 | Inoue et al. .................... 370/328 |
| 2010/0244979 A1 | 9/2010 | Matsuda et al. |
| 2011/0254639 A1 | 10/2011 | Tsutsumi et al. |

FOREIGN PATENT DOCUMENTS

| | | | | |
|---|---|---|---|---|
| EP | 1 482 639 A2 | | 12/2004 | |
| EP | 1 653 615 A1 | | 5/2006 | |
| EP | 1 860 773 A2 | | 11/2007 | |
| EP | 1883159 A1 | | 1/2008 | |
| JP | 60-043808 A | | 3/1985 | |
| JP | 60-126809 A | | 7/1985 | |
| JP | 4-249906 | * | 9/1992 | .................... 333/193 |
| JP | 5-055855 A | | 3/1993 | |
| JP | 06-152317 A | | 5/1994 | |
| JP | 7-226602 | * | 8/1995 | |
| JP | 09-167937 A | | 6/1997 | |
| JP | 11-214908 A | | 8/1999 | |
| JP | 11-251861 A | | 9/1999 | |
| JP | 11-346142 A | | 12/1999 | |
| JP | 2000-022493 A | | 1/2000 | |
| JP | 2001-186033 A | | 7/2001 | |
| JP | 2002-76829 A | | 3/2002 | |
| JP | 2002-84165 A | | 3/2002 | |
| JP | 2003-249841 A | | 9/2003 | |
| JP | 2004-523176 A | | 7/2004 | |
| JP | 2004-336181 A | | 11/2004 | |
| JP | 2004-349893 A | | 12/2004 | |
| JP | 2005-045099 A | | 2/2005 | |
| JP | 2005-184773 A | | 7/2005 | |
| JP | 2006-60747 A | | 3/2006 | |
| JP | 2006-135447 A | | 5/2006 | |
| JP | 2006-135921 A | | 5/2006 | |
| JP | 2006-311041 A | | 11/2006 | |
| JP | 2007-312324 A | | 11/2007 | |
| WO | 02/071610 A1 | | 9/2002 | |
| WO | 2006/118039 A1 | | 11/2006 | |
| WO | WO-2009/025106 A1 | | 2/2009 | |
| WO | 2010/073377 A1 | | 7/2010 | |

OTHER PUBLICATIONS

Written Opinion (PCT/ISA/237) issued in PCT/JP2008/073752 mailed in Mar. 2009.

International Search Report (ISR) issued in PCT/JP2008/058416 mailed in Aug. 2008.

The Office Action dated Nov. 9, 2011, in U.S. Appl. No. 13/167,620.

* cited by examiner

DUPLEXER, SUBSTRATE FOR DUPLEXER, AND ELECTRONIC APPARATUS

CROSS-REFERENCE TO RELATED APPLICATION

This application is based upon and claims the benefit of priority of the prior Japanese Patent Application No. 2008-332671, filed on Dec. 26, 2008, the entire contents of which are incorporated herein by reference.

FIELD

A certain aspect of the embodiments discussed herein is related to a duplexer, a substrate for a duplexer, and an electronic apparatus.

BACKGROUND

A duplexer is used for a wireless communication such as a mobile phone. FIG. 1 is a diagram illustrating a duplexer. A transmit filter 10 is connected between a common terminal Ant coupled to an antenna and a transmission terminal Tx. A receive filter 20 is connected between the common terminal Ant and a reception terminal Rx. The transmit filter 10 passes a signal in a transmission band, but suppresses a signal in a reception band of which a frequency is different from the frequency of the transmission band. Accordingly, the transmission signal inputted into the transmission terminal Tx passes through the transmit filter 10, and is outputted from the common terminal Ant. But the transmission signal is not outputted from the reception terminal Rx. The reception signal inputted from the reception terminal Rx passes through the receive filter 20, and is outputted from the reception terminal Rx. But the reception signal is not outputted from the transmission terminal Tx.

The transmit filter 10 and the receive filter 20 include surface acoustic wave (SAW) resonators, or film bulk acoustic wave resonators (FBAR). It is preferable that the transmit filter 10 and the receive filter 20 are hermetically sealed. Additionally, it is preferable to downsize the duplexer. For these reasons, packages such as laminated ceramic packages are used as packages for mounting the transmit filter 10 and the receive filter 20. These packages include a substrate for mounting chips such as filter chips. Foot pads for connecting the signal to the external are installed on an outer surface of the substrate. The foot pads behave as the common terminal, the transmission terminal, and the reception terminal.

Japanese Patent Laid-Open Publication No. 60-126809 discloses a capacitor of which a lower electrode and an upper electrode are polygonally-shaped, and are rotated so that they do not overlap each other. Japanese Patent Laid-Open Publication No. 60-43808 discloses a capacitor of which a lower electrode and an upper electrode are rectangular, and of which longer directions are at right angles each other. Japanese Patent Laid-Open Publication No. 2005-45099 discloses a capacitor of which a lower electrode's area is larger than an upper electrode's area.

SUMMARY

According to an aspect of the present invention, there is provided A duplexer including: a transmit filter connected between a common terminal and a transmission terminal; a receive filter connected between the common terminal and a reception terminal; a capacitor connected in parallel with one of the transmit filter and the receive filter and provided between two terminals of the common terminal, the transmission terminal, and the reception terminal; and a package including: an insulating layer; foot pads that include the common terminal, the transmission terminal and the reception terminal and are formed on one surface of the insulating layer; and interconnections formed on another surface opposite to the one surface of the insulating layer, wherein the capacitor is composed of two capacitor forming units that are connected in parallel with each other and are formed with at least one foot pad of the foot pads and two of the interconnections that overlap with two opposing sides of the at least one food pad respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

In the duplexer, it is preferable to improve isolation characteristics between the transmission terminal Tx and the reception terminal Rx. Especially, it is preferable to suppress the transmission signal leaking from the reception terminal Rx. To prevent the leakage of the transmission signal to the reception terminal Rx, there is a method installing a filter that suppresses the transmission signal and passes the reception signal at the reception terminal side. However, this method makes the duplexer bigger, higher in cost, and more complex.

Additionally, there is another method adding a capacitor or an LC circuit to the filter. Because the frequency for mobile phones is very high from hundreds of megahertz (MHz) to several gigahertz (GHz), a C and an L need to be highly precise. The precisions of the C and the L are high in the integrated passive device (IPD) fabricated with the process same as the process of a semiconductor device. But it prevents the downsizing and cost reducing because an IPD is a separate chip from the filter. To solve this problem, there is a method forming the capacitor by forming interconnections on both surfaces of the insulating layer such as ceramics in the package. Because this method can form the capacitor in the package, the downsizing and the cost reduction are possible. But the capacitance values of the capacitors vary widely, and this prevents high precisions.

A description will now be given of embodiments of the present invention with reference to the accompanying drawings.

First Embodiment

Figure 1:
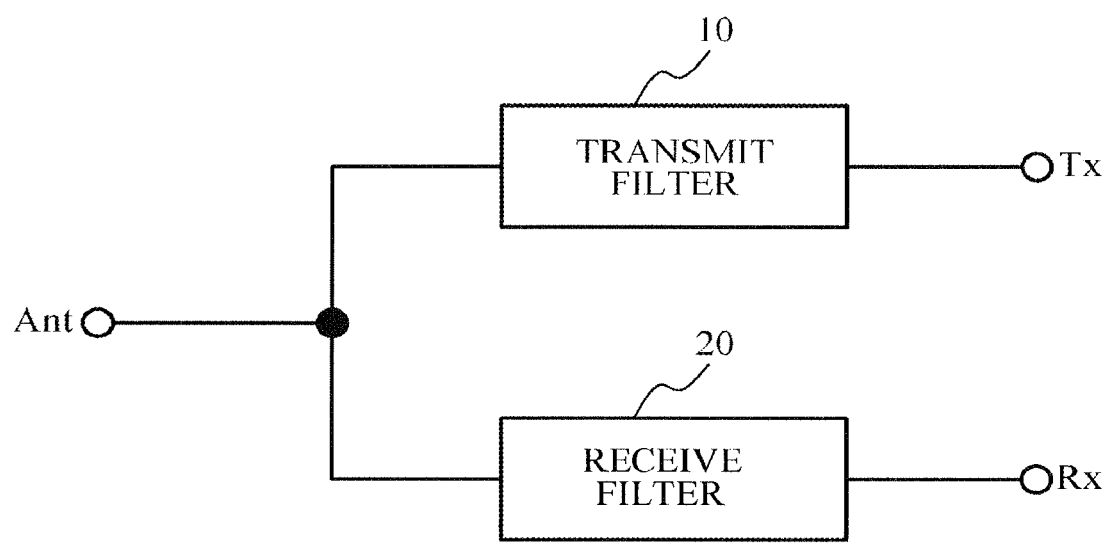
FIG. 1 is a block diagram of a duplexer of a related art.
Figure 2:
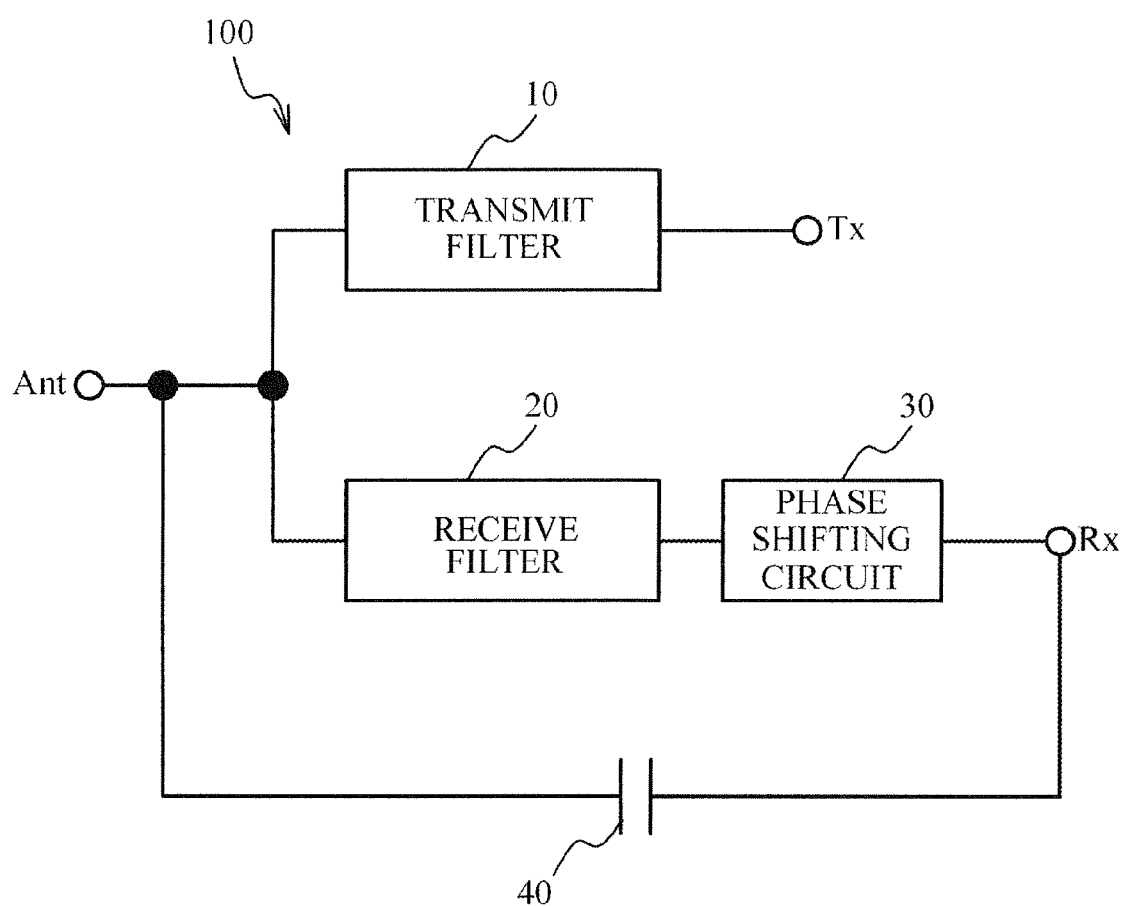
FIG. 2 is a block diagram of a duplexer in accordance with a first embodiment.

FIG. 2 is a block diagram illustrating a duplexer 100 in accordance with a first embodiment. As illustrated in FIG. 2, a phase shifting circuit 30 is connected in series with the receive filter 20 between the receive filter 20 and the reception terminal Rx in the first embodiment compared to FIG. 1. A capacitor 40 is connected in parallel with the receive filter 20 between the common terminal Ant and the reception terminal Rx. The phase shifting circuit 30 is the circuit that shifts the phase of the passband signal of the receive filter 20. The capacitor 40 connects the common terminal Ant to the reception terminal Rx in the high frequency (e.g. from 800 MHz to 2.5 GHz used for mobile phones), and disconnects in the direct current.

Figure 3:
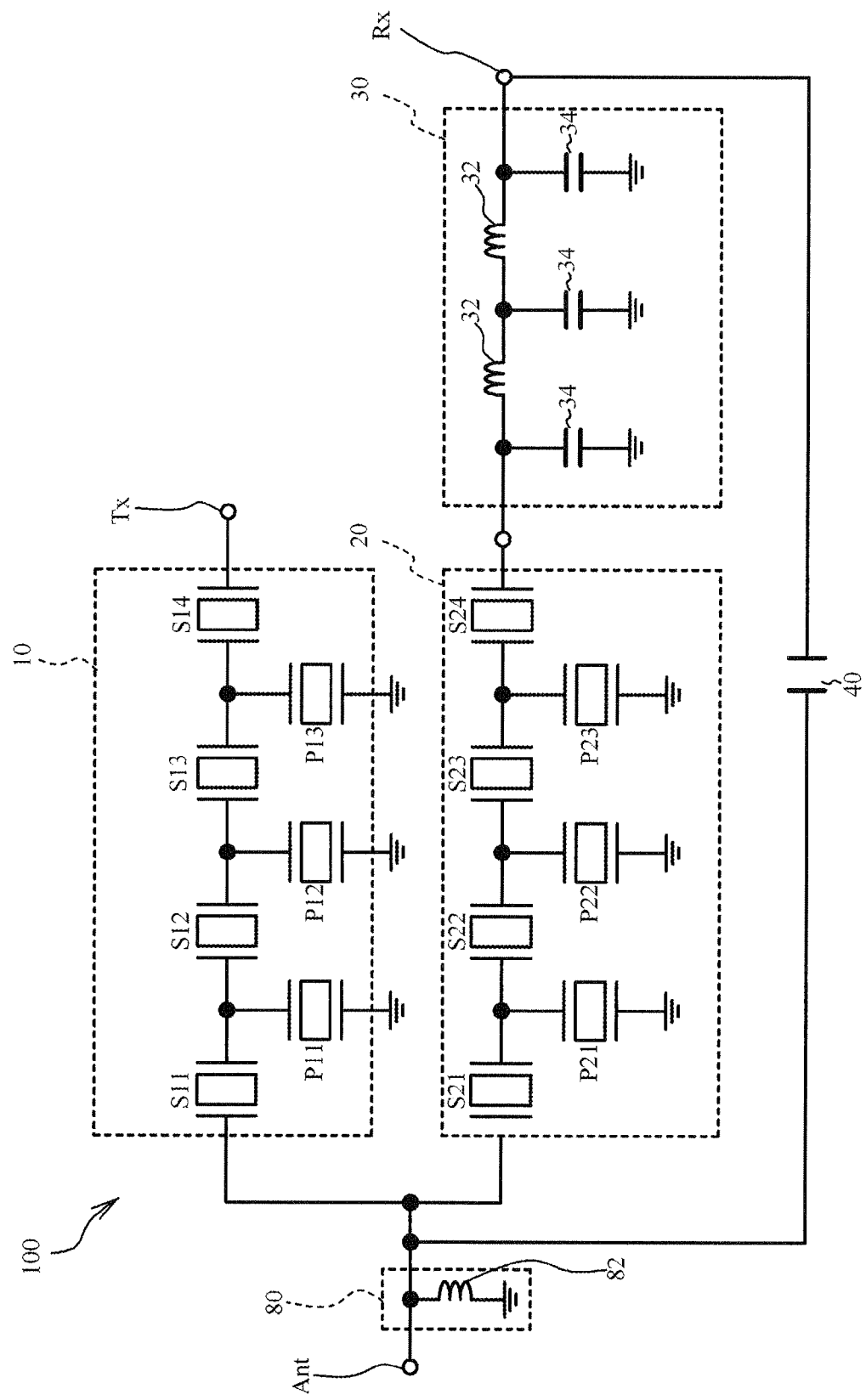
FIG. 3 is a diagram illustrating a circuit configuration of a duplexer in accordance with the first embodiment.

FIG. 3 is a diagram illustrating a configuration of a circuit of the duplexer in accordance with the first embodiment. The transmit filter 10 and the receive filter 20 may be ladder type filters. In the transmit filter 10, series resonators S11 through S14 and parallel resonators P11 through P13 are formed into a ladder shape. In the receive filter 20, series resonators S21 to S24 and parallel resonators P21 to P23 are formed into a ladder shape. The surface acoustic wave resonators are used for the series resonators S11 to S14 and S21 to S24, and the parallel resonators P11 to P13 and P21 to P23. A film bulk acoustic wave resonator and a solid mounted resonator (SMR) can be used as well.

The phase shifting circuit 30 includes inductors 32 and capacitors 34. The indictors 32 are connected in series, and the capacitors 34 are connected in parallel. A shifting angle can be set by changing the number of the inductor 32 and the capacitor 34. A matching circuit 80 is connected between the common terminal Ant and the transmit filter 10 and the receive filter 20. The matching circuit 80 includes an inductor 82 connected between the common terminal Ant and the ground.

An insertion loss and an isolation of the duplexer for W-CDMA (Wideband Code Division Multiple Access) are simulated under the condition that the pass band of the transmit filter 10 is 1920 to 1980 MHz, and the pass band of the receive filter 20 is 2110 to 2170 MHz. The capacitance value of the capacitor 40 is assumed as 15 fF, and the shifting angle of the phase shifting circuit 30 is assumed as 191 degrees.

Figure 4A:
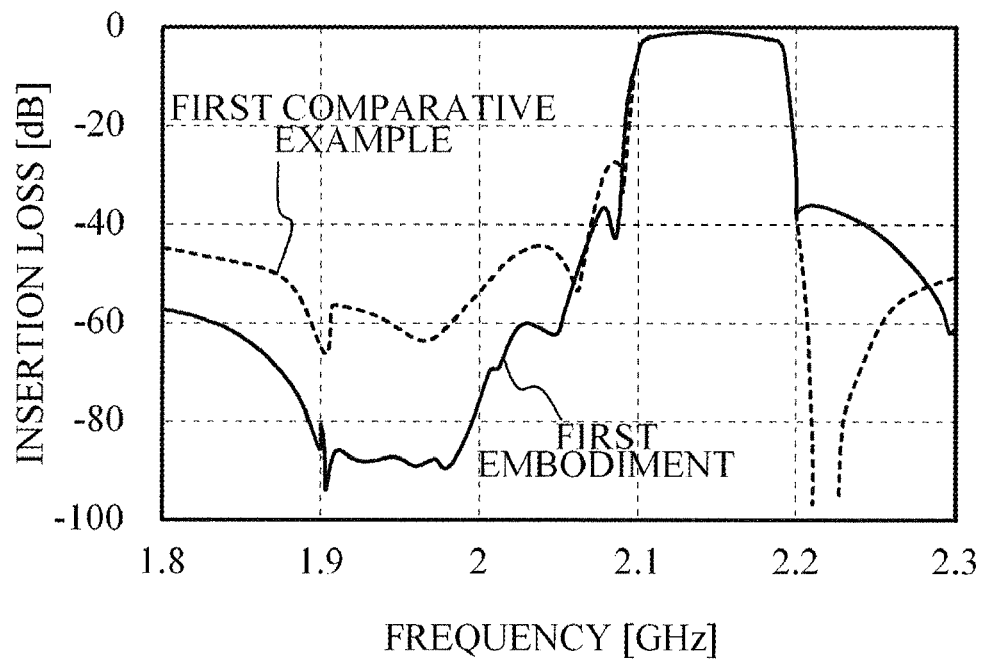
FIGS. 4A and 4B are diagrams illustrating the passing characteristics of the first embodiment and a first comparative example.
Figure 4B:
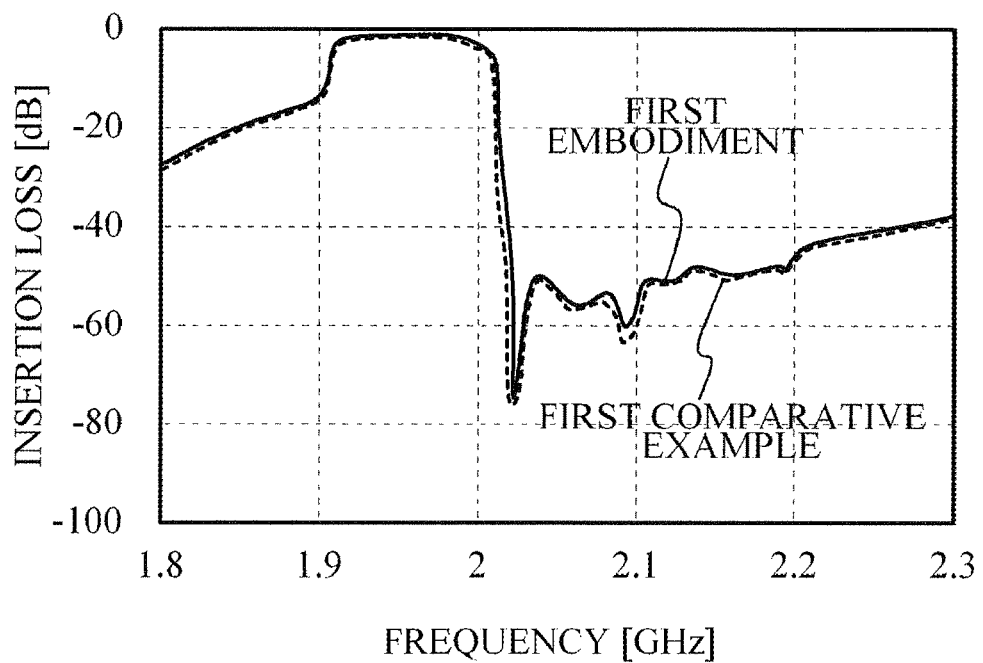

FIGS. 4A and 4B are diagrams illustrating passing characteristics of the receive filter 20 and the transmit filter 10 respectively. The first embodiment is illustrated in full line, and the first comparative example is illustrated in dash line. The first comparative example is a duplexer that does not include the phase shifting circuit 30 and the capacitor 40. As illustrated in FIG. 4A, the attenuation of the receive filter 20 in the transmission band of the first embodiment is large compared to the first comparative example. The passing characteristics in the reception band of the first embodiment and the first comparative example are almost same. As illustrated in FIG. 4B, the passing characteristics of the transmit filter 10 of the first embodiment and the first comparative example are almost same.

Figure 5:
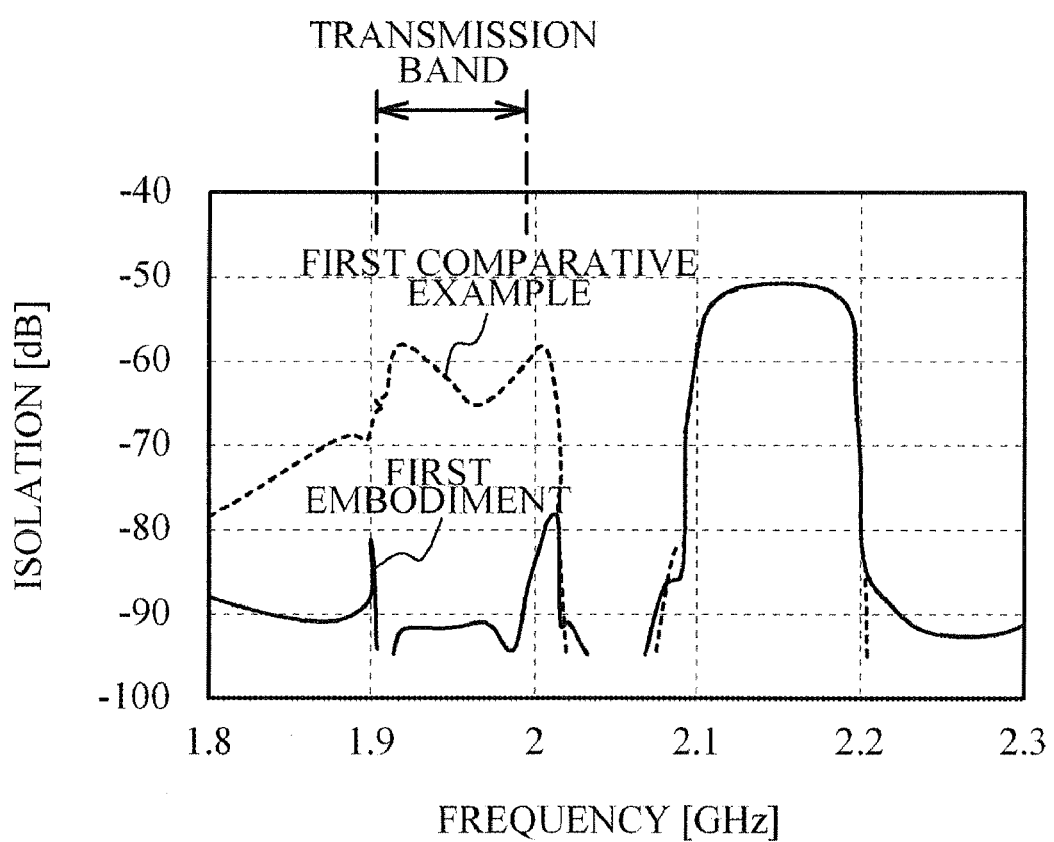
FIG. 5 is a diagram illustrating the isolation characteristics of the first embodiment and the first comparative example.

FIG. 5 is a diagram illustrating frequency characteristics of the isolation indicating a leakage of the transmission signal from the transmission terminal Tx to the reception terminal Rx. The first embodiment is illustrated in full line, and the first comparative example is illustrated in dash line. The isolation in the transmission band of the first embodiment is improved more than 25 dB compared to the first comparative example. As described above, the isolation characteristics are improved with the first embodiment.

As described above, the transmission signal from the common terminal Ant to the reception terminal Rx via the receive filter 20 and the phase shifting circuit 30 and the transmission signal from the common terminal Ant to the reception terminal Rx via the capacitor 40 have almost opposite phases. Additionally, the capacitance value of the capacitor 40 is set so that the strengths of the transmission signals via each path are almost same. Accordingly, because the transmission signals via each path balance are canceled, isolation characteristics are improved.

Figure 6:
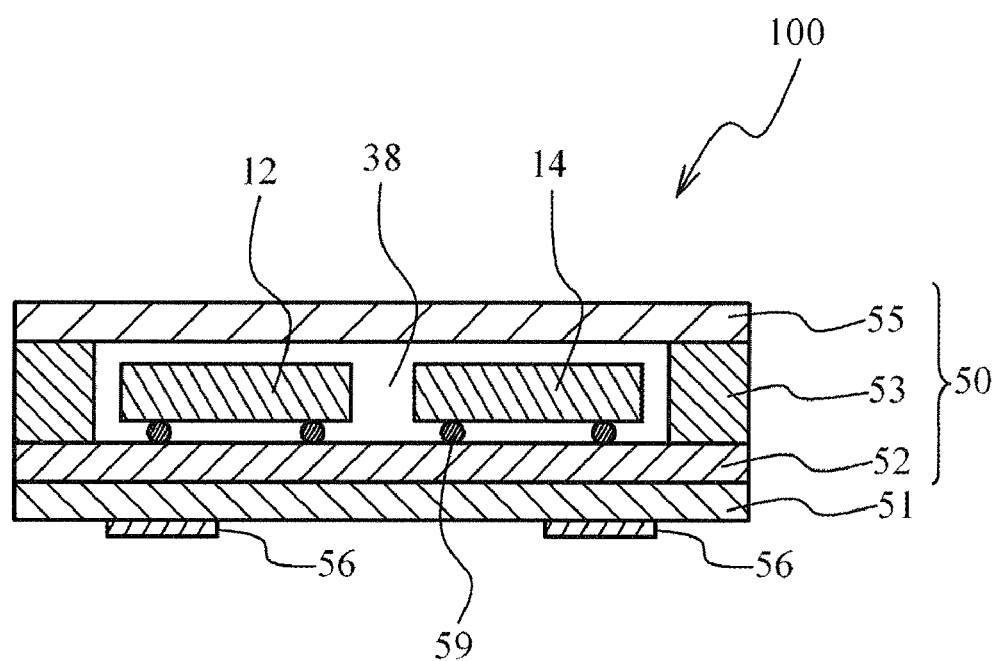
FIG. 6 is a cross sectional view of the first embodiment.

FIG. 6 is a cross sectional view of the duplexer 100. As illustrated in FIG. 6, a package 50 includes a substrate for the duplexer, which has three laminated ceramic layers; a first layer 53, a die attach layer 52, and a foot pad layer 51. The first layer 53 forms a cavity 38 that seals filter chips 12 and 14. The filter chips 12 and 14 are sealed by laying down a ridge 55 on the first layer 53. The filter chips 12 and 14 are flip-chip-mounted on the surface of the die attach layer 52 (a mount unit) through bumps 59. The bumps 59 are connected to interconnections formed on the upper surface of the dia touch layer 52. Foot pads 56 are formed on the back surface of the foot pad layer 51. The transmit filter 10 is formed within the filter chip 12, and the receive filter 20 is formed within the filter chip 14.

Figure 7A:
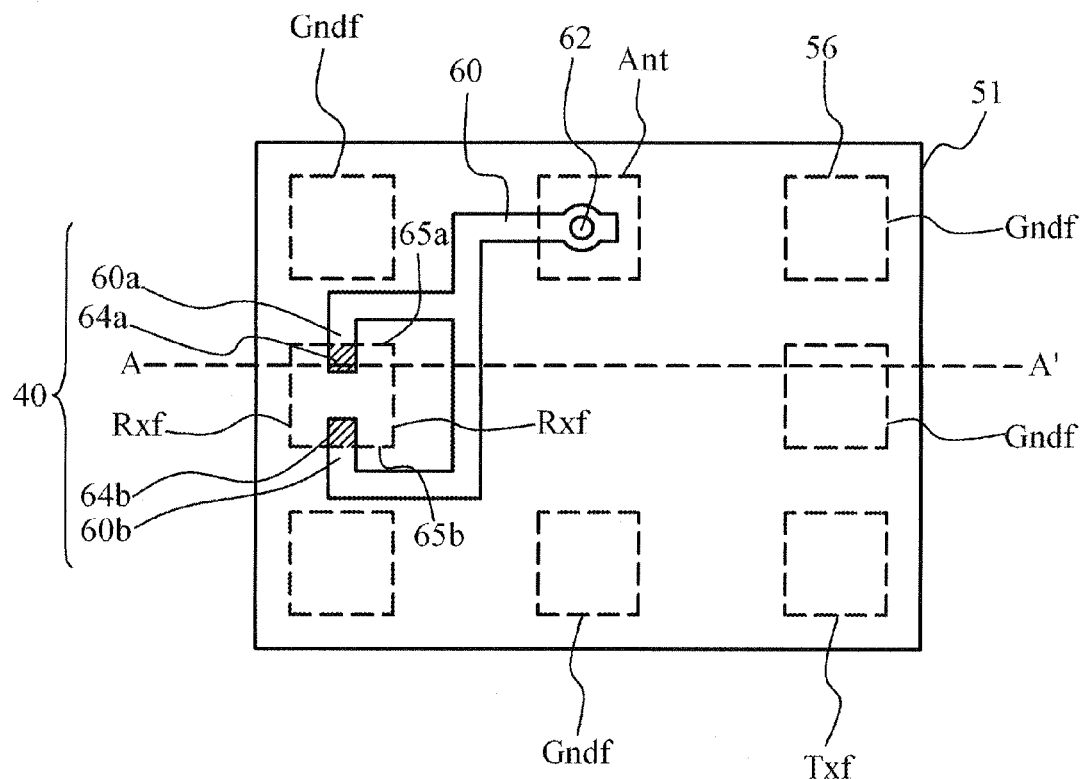
FIG. 7A is a top view of a foot pad layer.
Figure 7B:
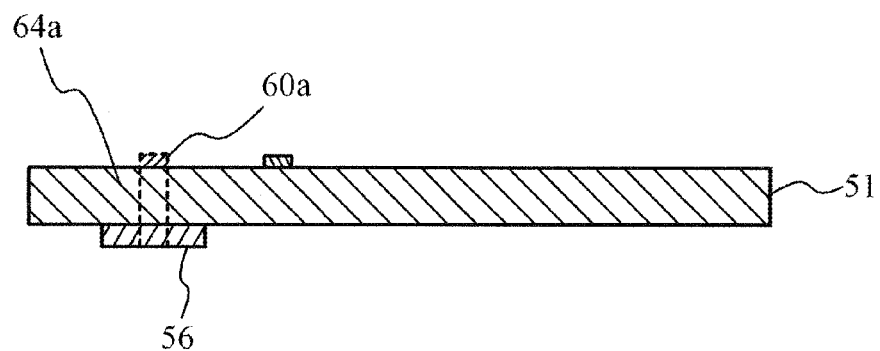
FIG. 7B is a cross sectional view thereof.

FIG. 7A is a plane view of the upper surface of the foot pad layer 51. FIG. 7B is a cross sectional view taken along the line A-A' of FIG. 7A. In FIG. 7A, the foot pads 56 formed on the lower surface of the foot pad layer 51 are illustrated in dash line transparently. As illustrated in FIG. 7A, a common foot pad Antf corresponding to the common terminal Ant, a transmission foot pad Txf corresponding to the transmission terminal Tx, a reception foot pad Rxf corresponding to the reception terminal Rx, and ground foot pads Gndf corresponding to ground terminals are formed on the lower surface (one surface) of the foot pad layer 51.

An interconnection 60 connected to the common foot pad Antf is formed on the upper surface (a surface opposite to the one surface) of the foot pad layer 51. The interconnection 60 and the common foot pad Antf are coupled through a via 62 that pierces the foot pad layer 51 and is embedded with a conducting material. The interconnection 60 is formed so that a part of the interconnection 60 overlaps with the reception foot pad Rxf. More specifically, two interconnections 60a and 60b overlap with two opposing sides 65a and 65b of the reception foot pad Rxf, respectively. The reception foot pad Rxf and the two interconnections 60a and 60b form two capacitor forming units 64a and 64b connected each other in parallel. Thus, the capacitor 40 includes the two capacitor forming units 64a and 64b. It should be noted that other interconnections except the interconnection 60 are not illustrated in FIGS. 7A and 7B.

Now, the advantage of the first embodiment is described. A capacitance C of a parallel plate type capacitor is $C=(\epsilon_r \epsilon_0 S)/d$ where $\epsilon_0$ is a permittivity in a vacuum, $\epsilon_r$ is a relative permittivity, S is an electrode area, and d is a distance between electrodes. When alumina ceramic of which a film thickness is 100 μm is used as the foot pad layer 51, $\epsilon_r$ is 9.8, and d is 100 μm. S is $1.73 \times 10^{-8}$ m$^2$ to make the capacitance value C of the capacitor 40 equal to 15 fF.

Figure 8A:
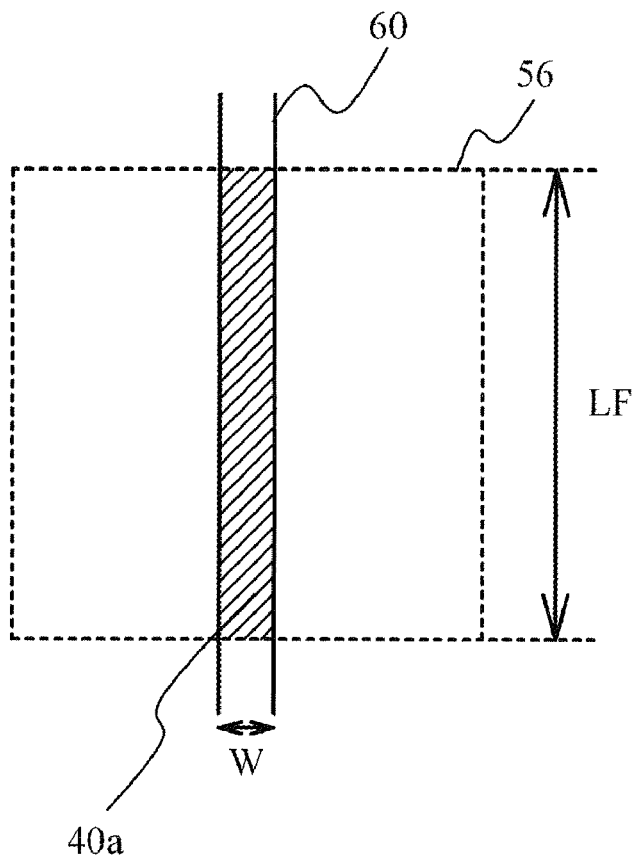
FIGS. 8A and 8B are diagrams illustrating capacitors of second and third comparative examples.
Figure 8B:
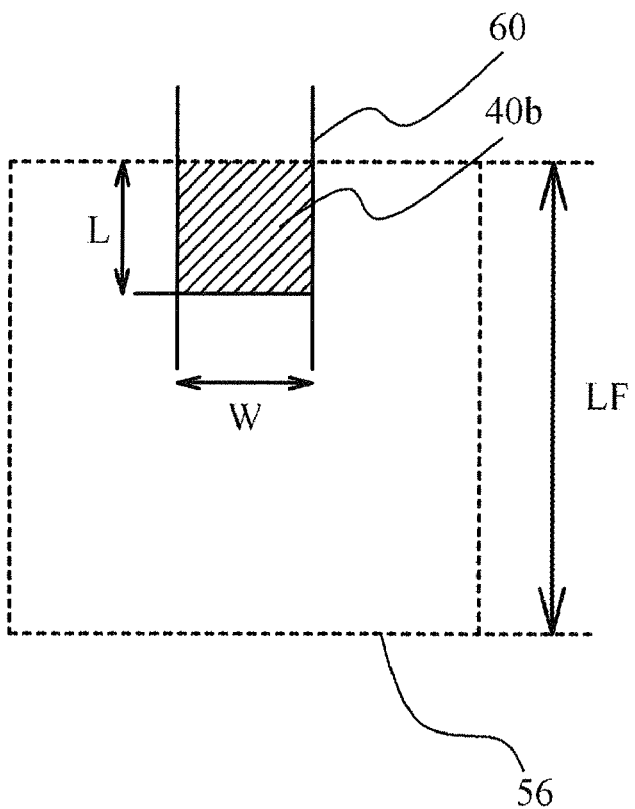

FIGS. 8A and 8B are diagrams illustrating capacitors 40a and 40b including a foot pad 56 and an interconnection 60 as the second comparative example and the third comparative example. Referring to FIG. 8A, the size of the foot pad 56 may be practically standardized by package sizes. For example, in the package of which the area of base is 3.0 mm×2.5 mm size, one side length of the foot pad 56 LF is 500 μm. When try to form the interconnection 60 crossing the foot pad 56 in the capacitor 40a of which S is $1.73 \times 10^{-8}$ m$^2$, the width of the interconnection 60 W is 34.6 μm. Since the interconnection 60 is formed with a printing method for reducing cost, it is difficult to form patterns less than 50 μm. As described above, because the size of the foot pad 56 is fixed, it is difficult to form the capacitor of which the capacitance value is small in the second comparative example.

As illustrated in the third comparative example of FIG. 8B, when the width W of the interconnection 60 is 100 μm and the interconnection 60 is formed on only one side of the foot pad 56, the overlap length of the interconnection 60 and the foot pad 56 L is 173 μm. The foot pad 56 is formed on the lower surface of the foot pad layer 51 with the printing method for example. The positional precision of the printing method and the crossover precision between ceramic layers are not good. Therefore, the positional relation between the foot pad layer 51 and the interconnection 60 may be different from the desirable positional relation. In the third comparative example in FIG. 8B, when the interconnection 60 is formed so as to be displaced to the foot pad 56, the precise capacitor is not provided because the capacitance value of the capacitor 40b changes.

Figure 9A:
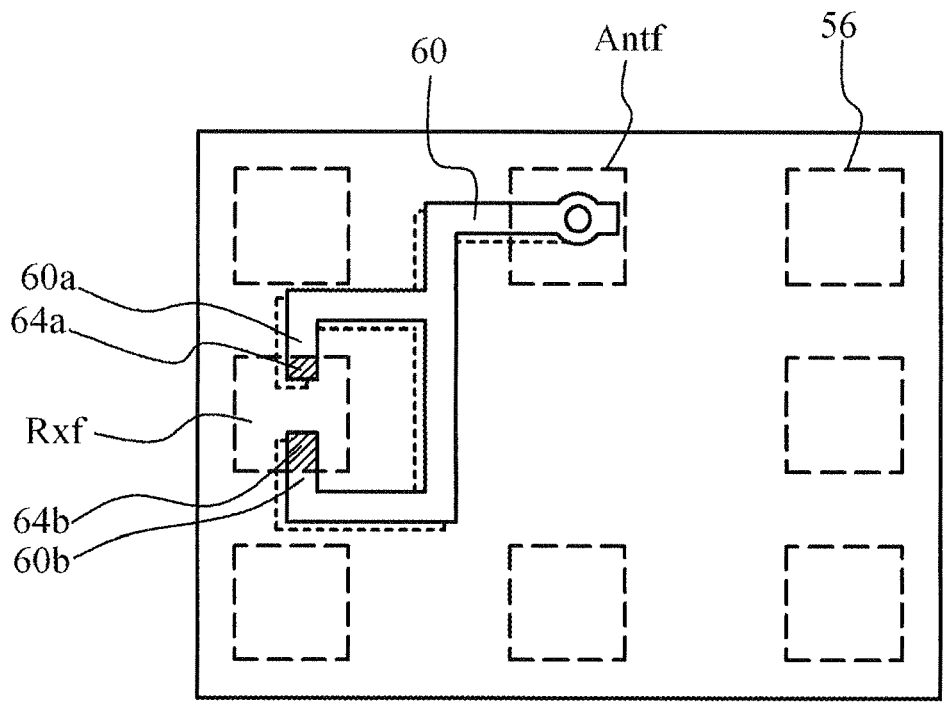
FIGS. 9A and 9B are diagrams illustrating the advantage of the first embodiment.
Figure 9B:
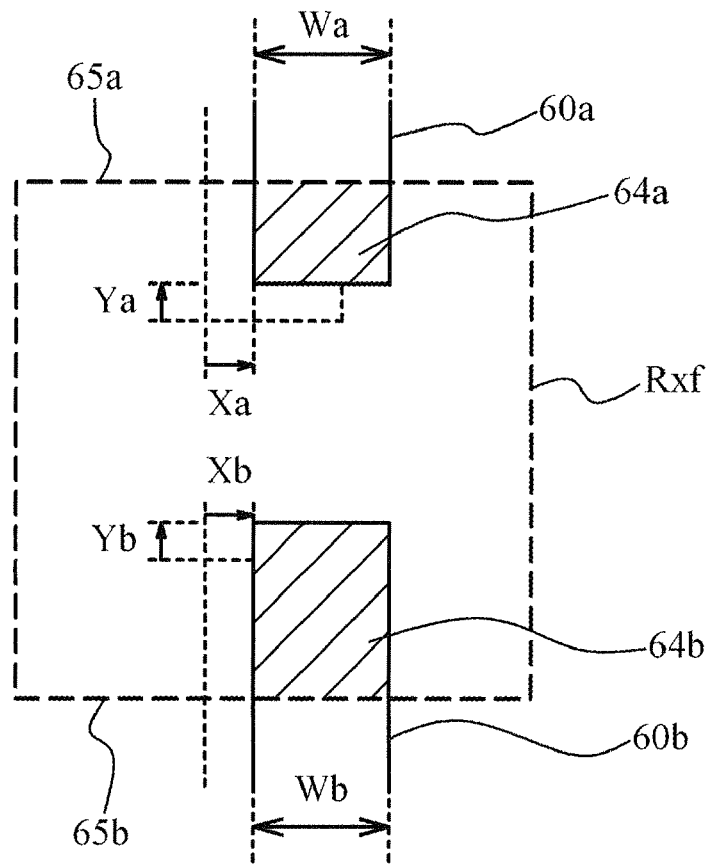

FIG. 9A is a diagram illustrating a case where a displacement of the foot pad 56 and the interconnection 60 occurs. FIG. 9B is an enlarged diagram around the reception foot pad Rxf in FIG. 9A. The desirable position of the interconnection 60 to the foot pad 56 is illustrated in dash line. The positional relation between the interconnection 60 and the foot pad 56 that may be observed when the displacement occurs is illustrated in full line. When the widths Wa and Wb of the interconnections 60a and 60b are 100 μm, the overlap lengths of the interconnections 60a and 60b with the foot pad 56 are 173 μm in total and 86.5 μm in one side. As illustrated in FIG. 9A, the interconnection 60a is formed on the position that is Xb in x direction and Yb in y direction away from the desirable position. Xa and Xb are almost same, and Ya and Yb are almost same. Because the capacitor forming units 64a and 64b are connected in parallel, the capacitance value of the capacitor 40 is the sum of the capacitance values of the capacitor forming units 64a and 64b. Therefore, even though the interconnection 60 is not in the correct position to the foot pad 56, the capacitance value of the capacitor 40 changes little. It should be noted that it is preferable that the widths of the capacitor forming units 64a and 64b in the x direction are almost same to improve the precision of the capacitance value of the capacitor 40 more. Additionally, it is preferable that the sides 65a and 65b are parallel and the shapes of the capacitor forming units 64a and 64b are rectangles or quadrates.

According to the first embodiment, because the capacitor 40 is connected in parallel with the receive filter 20 between the reception foot pad Rxf and the common foot pad Antf (more specifically, between the reception terminal Rx and the common terminal Ant), the isolation characteristics of the duplexer 100 are improved. The capacitor 40 is formed with the one surface on which the foot pad 56 is formed, and the interconnection 60 formed on the surface opposite to the surface of the foot pad layer 51 (an insulating layer). As described above, because the capacitor is formed with the foot pad 56 which is a terminal to which the capacitor 40 is coupled, the downsizing and the cost reduction of the duplexer are possible. Additionally, the capacitor forming units 64a and 64b are formed with the foot pad 56 and the two interconnections 60a and 60b that overlap with the two opposing sides 65a and 65b of the foot pad 56 respectively, and are connected in parallel each other. Accordingly, as described in FIGS. 9A and 9B, even when the position between the foot pad 56 and the interconnection 60 is not correct, it is possible to suppress the change of the capacitance value. Therefore, it is possible to improve the precision of the capacitance value.

Second Embodiment

Figure 10:
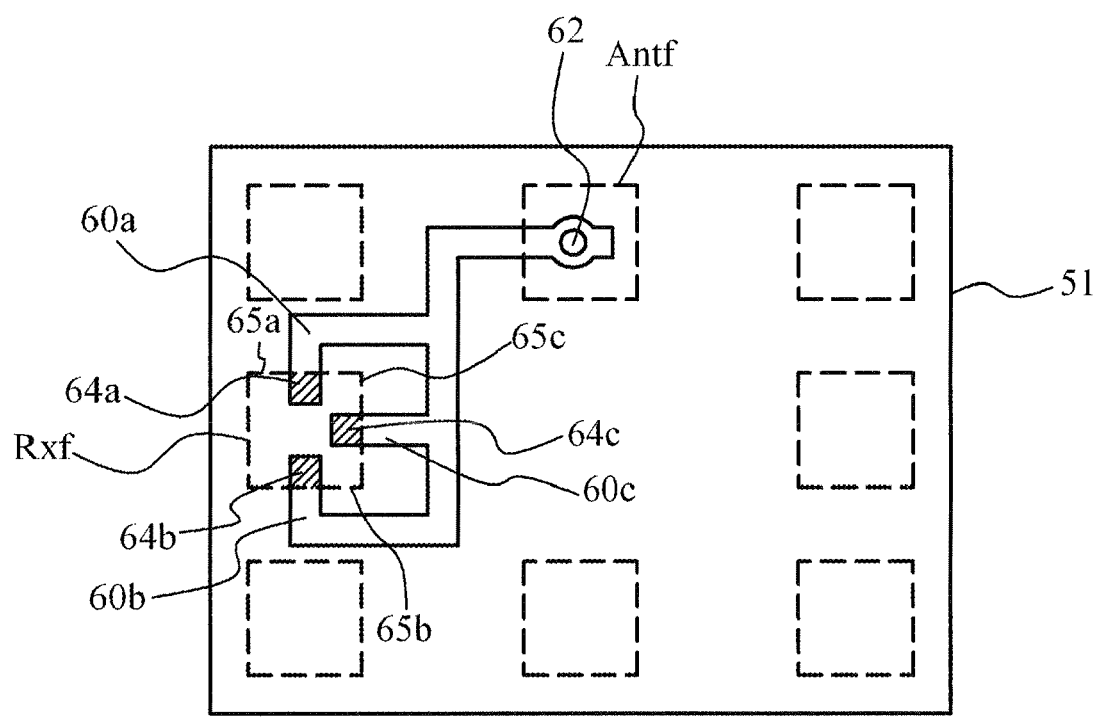
FIG. 10 is a top view of the foot pad layer in accordance with a second embodiment.

A second embodiment is an example that the number of the capacitor forming units is three. FIG. 10 is a top view of a foot pad layer 51 in accordance with the second embodiment. As illustrated in FIG. 10, in the second embodiment, another capacitor forming unit 64c is formed with the reception foot pad Rxf and another interconnection 60c that overlaps with another side 65c that is different from the two sides 65a and 65b. The capacitor forming unit 64c is connected in parallel with the two capacitor forming units 64a and 64b. Other configurations are the same as the configurations illustrated in FIG. 9A of the first embodiment. As described in the second embodiment, the number of capacitor forming units can be three. Accordingly, it is possible to enlarge the capacitance value of the capacitor 40.

Third Embodiment

Figure 11:
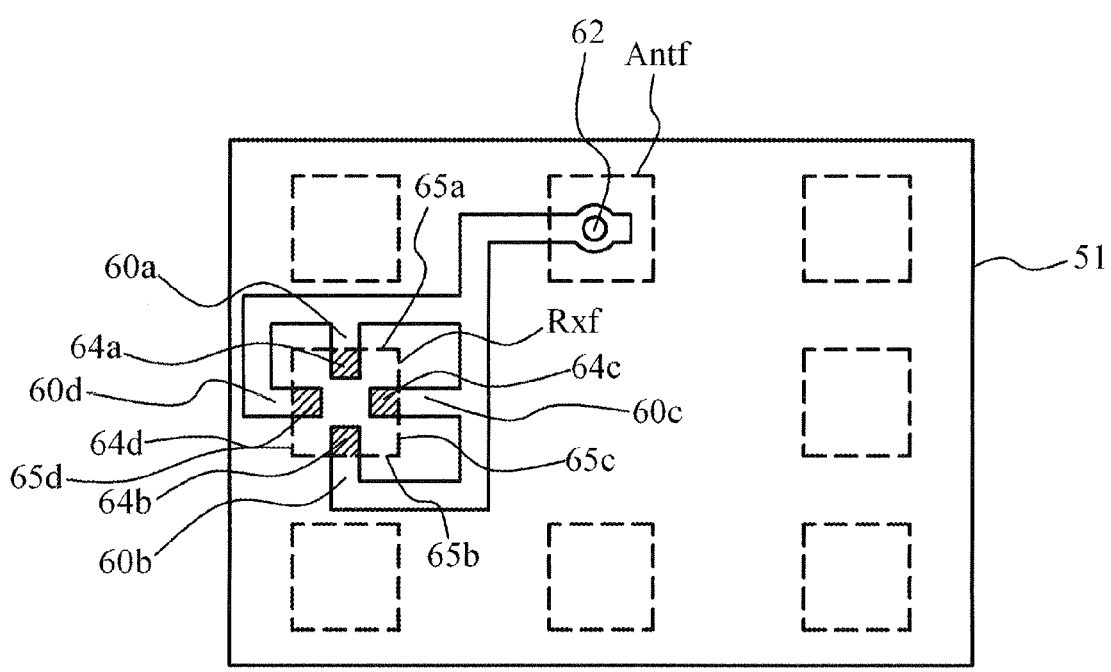
FIG. 11 is a top view of the foot pad layer in accordance with a third embodiment.

A third embodiment is an example that the number of capacitor forming units is four. FIG. 11 is a top view of the foot pad layer 51 in accordance with the third embodiment. As illustrated in FIG. 11, in the third embodiment, other two capacitor forming units 64c and 64d are formed with the reception foot pad Rxf, and other two interconnections 60c and 60d that overlap with other two opposing sides 65c and 65d that are different from the two sides 65a and 65b. The capacitor forming units 64c and 64d are connected in parallel with the two capacitor forming units 64a and 64b. Other configurations are the same as the configurations illustrated in FIG. 9A of the first embodiment. As described above, the number of capacitor forming units can be four. Accordingly, it is possible to enlarge the capacitance value of the capacitor 40.

It is preferable that the other sides 65c and 65d are perpendicular to the sides 65a and 65b in the second and third embodiments. Additionally, it is preferable that the shapes of the capacitor forming units 64c and 64d are rectangles or squares. Accordingly, it is possible to make the capacitance value of the capacitor 40 more precise.

Fourth Embodiment

Figure 12A:
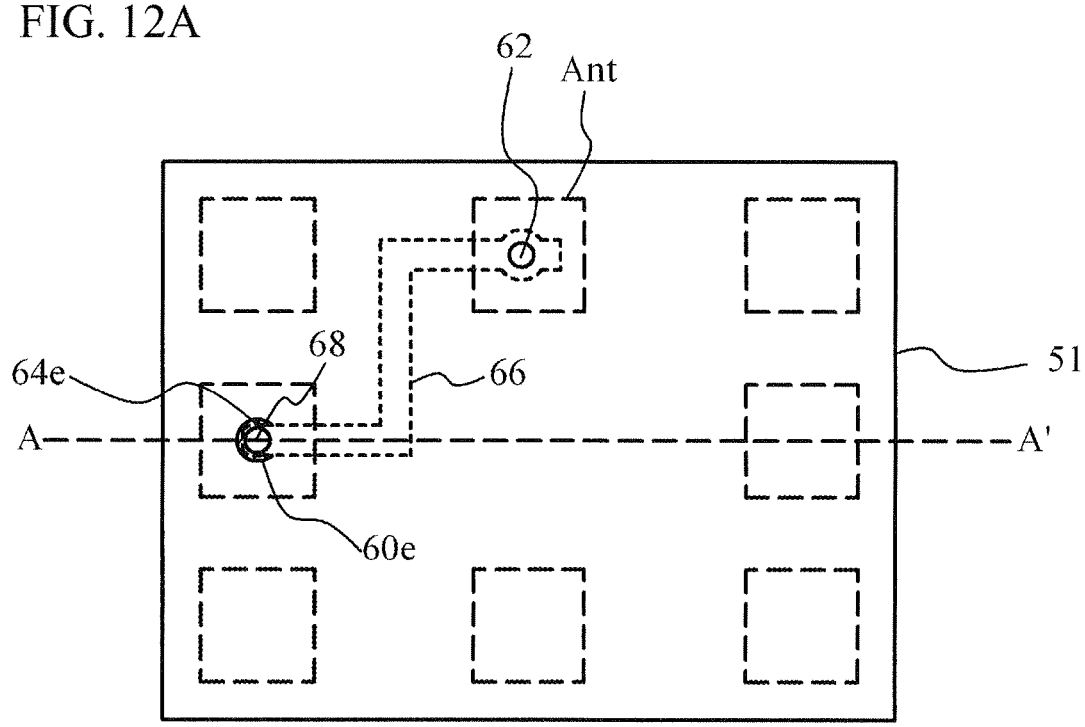
FIGS. 12A and 12B are a top view and a cross sectional view of the foot pad layer in accordance with a fourth embodiment.
Figure 12B:
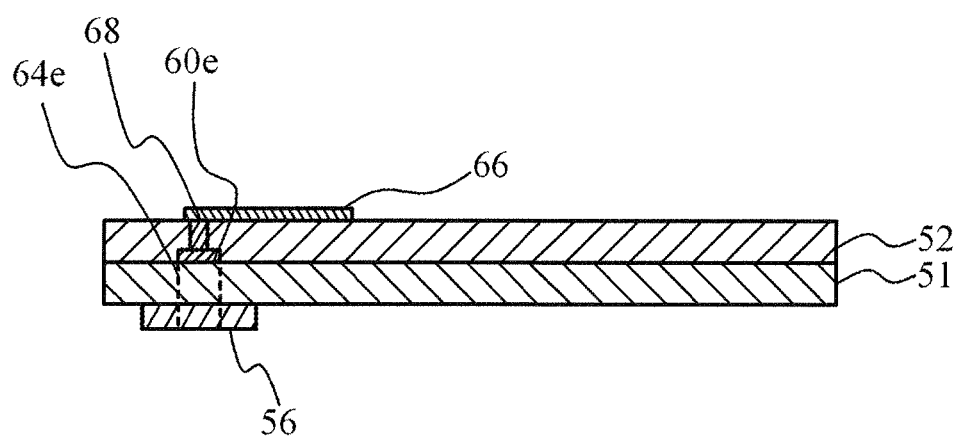

A fourth embodiment is an example that the foot pad includes the interconnection. FIG. 12A is a top view of the foot pad layer 51 in accordance with the fourth embodiment. The foot pad layer 51 formed on the lower surface of the foot pad layer 51 and an interconnection 66 formed on the upper surface of the die attach layer 52 are illustrated in dash line. FIG. 12B is a cross sectional view taken along the line A-A' of FIG. 12A.

As illustrated in FIG. 12A and FIG. 12B, an interconnection 60e formed on the upper surface of the foot pad layer 51 is included in the foot pad 56. More specifically, the interconnection 60e does not overlap with peripheral sides of the foot pad 56. An interconnection 66 is formed on the upper surface of the die attach layer 52. Vias 62 and 68 that pierce the die attach layer 52 and are embedded with a metal are formed within the die attach layer 52. The interconnection 60e is coupled to the common foot pad Antf through the vias 62 and 68, and the interconnection 66. A capacitor forming unit 64e is formed with the foot pad 56 and the interconnection 60e.

According to the fourth embodiment, the interconnection 60e is formed so as to be included in the foot pad 56. Accordingly, even though the interconnection 60e is not in the correct position to the foot pad 56, the area of the capacitor forming unit 64e does not change. Therefore, it is possible to provide the precise capacitance.

Another interconnection 66 is formed on the opposite side to the reception foot pad Rxf. The interconnection 60e and the another interconnection 66 are coupled with the via (a via metal). As described above, by forming a lead from the interconnection 60e with the via material and the another interconnection 66, the interconnection 60e does not overlap with the peripheral sides of the reception foot pad Rxf, and the interconnection 60e can be coupled to the common foot pad Antf.

Additionally, it is preferable that the interconnection 60e has a circular shape. When the interconnection 60 is formed as the rectangle for example, corners of the interconnection 60 are not formed accurately if the interconnection 60 is formed with the printing method. Accordingly, the capacitance precision of the capacitor forming unit 64e is reduced. In the fourth embodiment, it is possible to make the capacitance value more precise by shaping the interconnection 60e in a circle.

Fifth Embodiment

Figure 13:
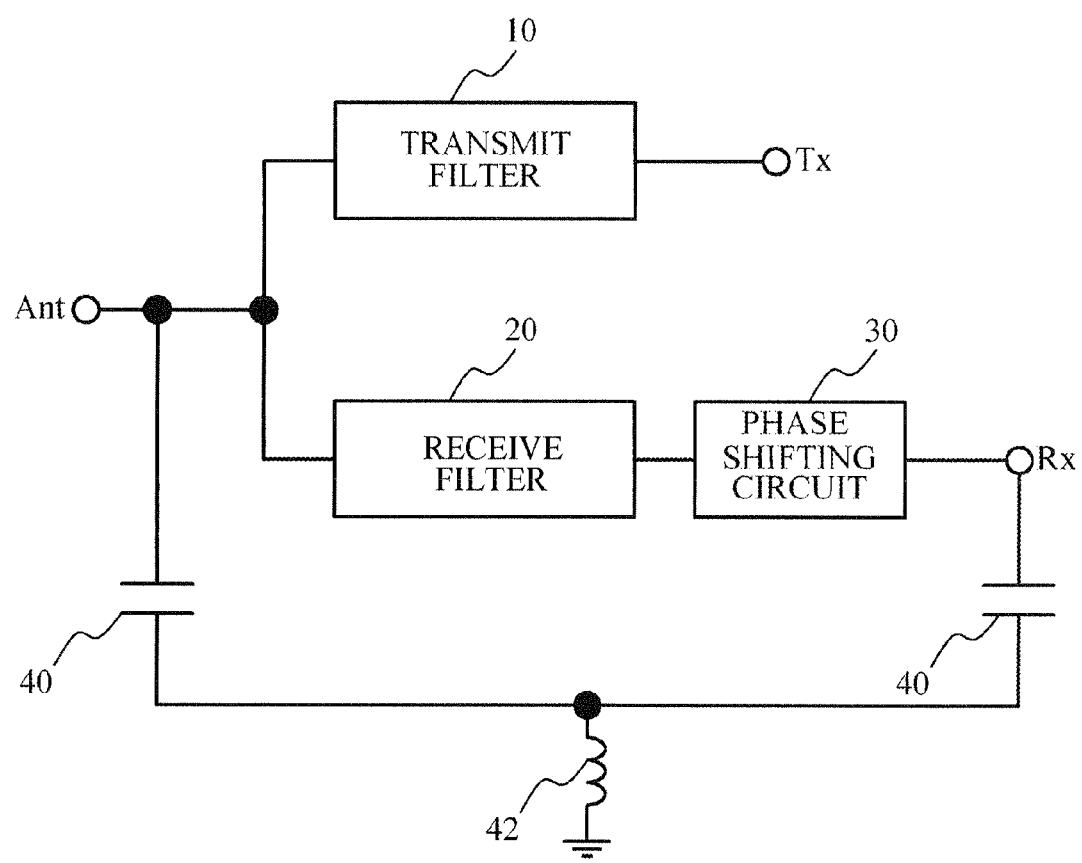
FIG. 13 is a block diagram of one example of a duplexer in accordance with a fifth embodiment.

FIG. 13 is a block diagram illustrating one example of the fifth embodiment. As illustrated in FIG. 13, two capacitors 40 are coupled in series between the common terminal Ant and the reception terminal Rx. The inductors 44 are coupled between the node between two capacitors 40 and the ground. As illustrated, multiple capacitors 40 can be installed. Additionally, the inductors 44 can be installed. It is possible to make the capacitance value of one capacitor 40 large by connecting multiple capacitors 40 in series. Therefore, it is possible to make the capacitance of the interconnection 60 be a certain level of largeness and to improve the precision of the capacitor 40.

Figure 14:
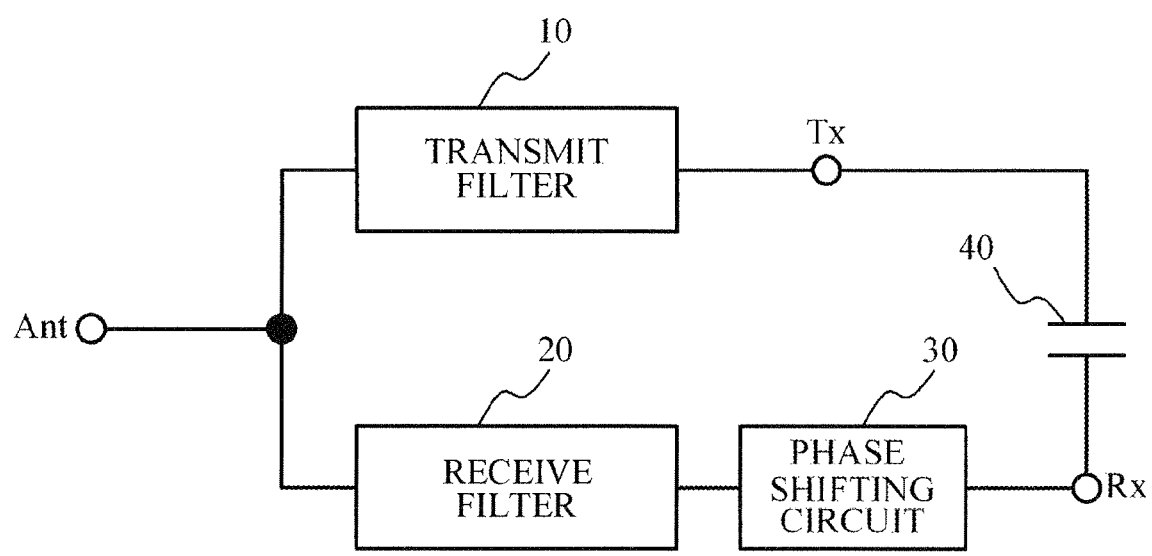
FIG. 14 is a diagram of another example of a duplexer in accordance with the fifth embodiment.

FIG. 14 illustrates another example of the fifth embodiment. The capacitor 40 is installed between the transmission terminal Tx and the reception terminal Rx. In this example, when the phase of the transmission signal of the path to the reception terminal Rx from the transmission terminal Tx via the transmit filter 10, the receive filter 20 and the phase shifting circuit 30 and the phase of the transmission signal of the path to the reception terminal Rx from the transmission terminal Tx via the capacitor 40 cancel each other, the isolation characteristics can be improved.

As described in the fifth embodiment, the capacitor 40 in the first to fourth embodiments is connected between the two terminals of the common terminal Ant, the transmission terminal Tx, and the reception terminal Rx. Additionally, the capacitor 40 is coupled in parallel with at least one of the transmit filter 10 and the receive filter 20. Furthermore, the capacitor forming unit is formed with the one foot pad of two foot pads of the common foot pad Antf, the transmission foot pad Txf, and the reception foot pad Rxf, and the interconnection 60 connected to another foot pad.

It is preferable that the phase shifting circuit 30 that shifts the phase of the passband signal of the transmit filter 10 (or the receive filter 20) is installed in series with the receive filter 20 (or the transmit filter 10) with which the capacitor 40 is coupled in parallel. This enables to make the phase difference between the signal via the capacitor 40 and the signal via the receive filter 20 (or the transmit filter 10) large. It is preferable that the signal transmitted from one of two terminals to another via the capacitor 40 and the signal transmitted from the one of two terminals to another via the transmit filter 10 and the receive filter 20 have opposite phase with each other. This enables to improve the isolation characteristics.

If the phase difference between the signal via the transmit filter 10 or the receive filter 20 and the signal via the capacitor 40 falls in a desirable range, the phase shifting circuit 30 may be omitted. It is preferable that one of the terminals to which the capacitor 40 is coupled is the reception terminal Rx, because a problem often occurs in the isolation from the transmission terminal Tx to the reception terminal Rx.

Sixth Embodiment

Figure 15:
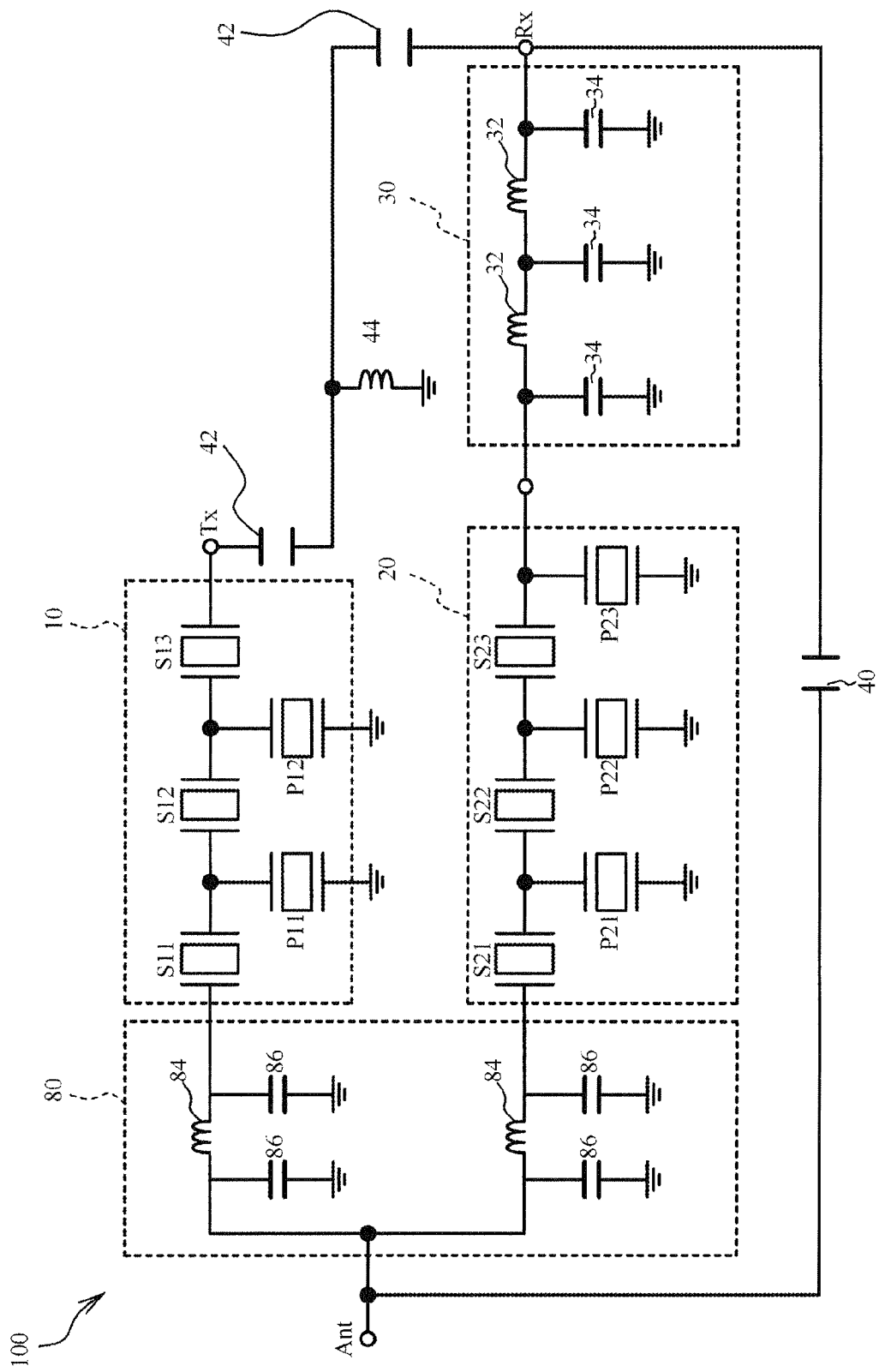
FIG. 15 is a diagram illustrating the circuit configuration of a duplexer in accordance with a sixth embodiment.

FIG. 15 is a diagram illustrating the circuit configuration of the duplexer in accordance with the sixth embodiment. The transmit filter 10 is a ladder type filter including the series resonators S11 to S13 and the parallel resonators P11 to P12. The receive filter 20 is a ladder type filter including the series resonators S21 to S23 and the parallel resonators P21 to P23. In the matching circuit 80, inductors 84 are connected in series between the common terminal Ant and the transmit filter 10, and capacitors 86 are connected in parallel between the common terminal Ant and the receive filter 20. Two capacitors 42 are connected in series between the transmission terminal Tx and the reception terminal Rx, and the inductor 44 is connected between the node between the capacitors 42 and the ground. Other configurations are the same as the configurations illustrated in FIG. 3 of the first embodiment.

As simulated in the first embodiment, the insertion loss and the isolation of the duplexer for W-CDMA are simulated under the condition that the pass band of the transmit filter 10 is 1920 to 1980 MHz, and the pass band of the receive filter 20 is 2110 to 2170 MHz. In the sixth embodiment, the capacitance value of the capacitor 40 is 0.8 fF, the capacitance value of each of the capacitors 42 is 0.37 pF, the inductance of the inductor 44 is 0.14 nH, and the shifting angle of the phase shifting circuit 30 is 158 degrees. In the sixth comparative example, the capacitors 40 and 42, and the inductor 44 are not installed.

Figure 16A:
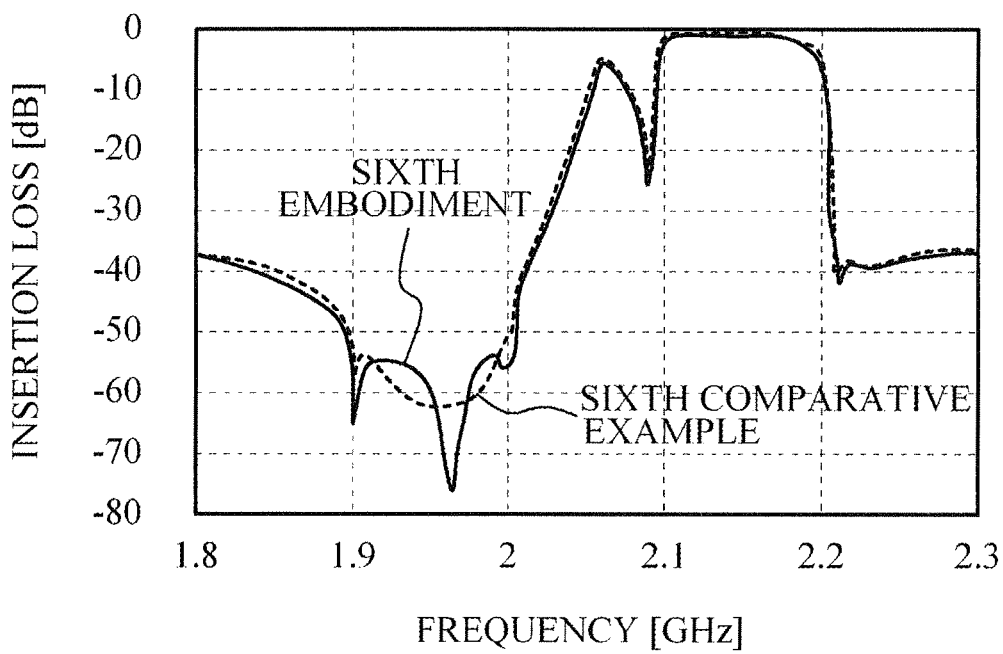
FIGS. 16A and 16B are diagrams illustrating the passing characteristics of the sixth embodiment and a sixth comparative example.
Figure 16B:
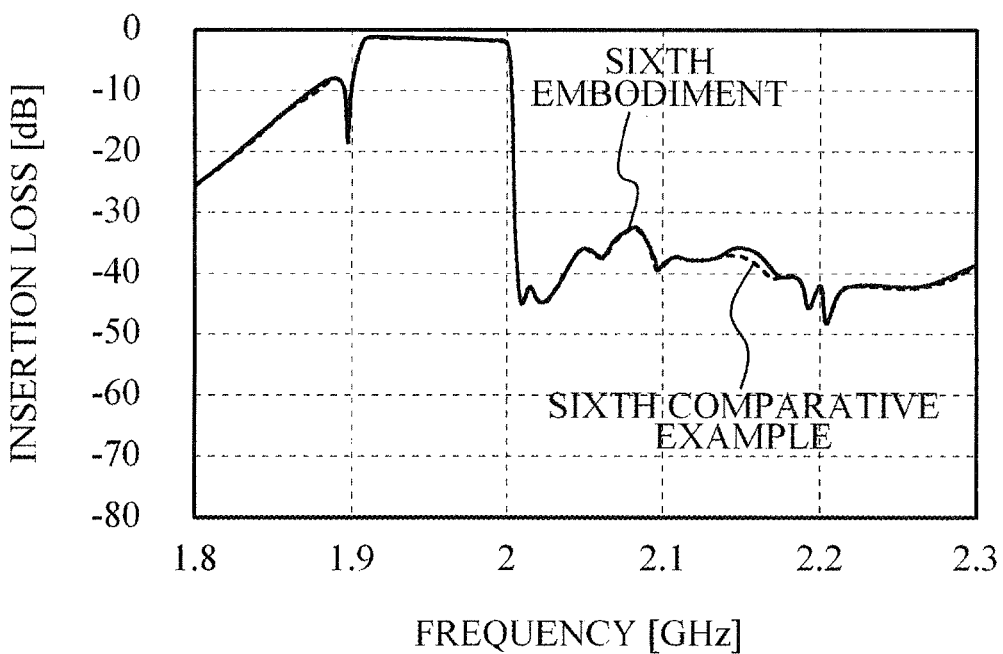
Figure 17:
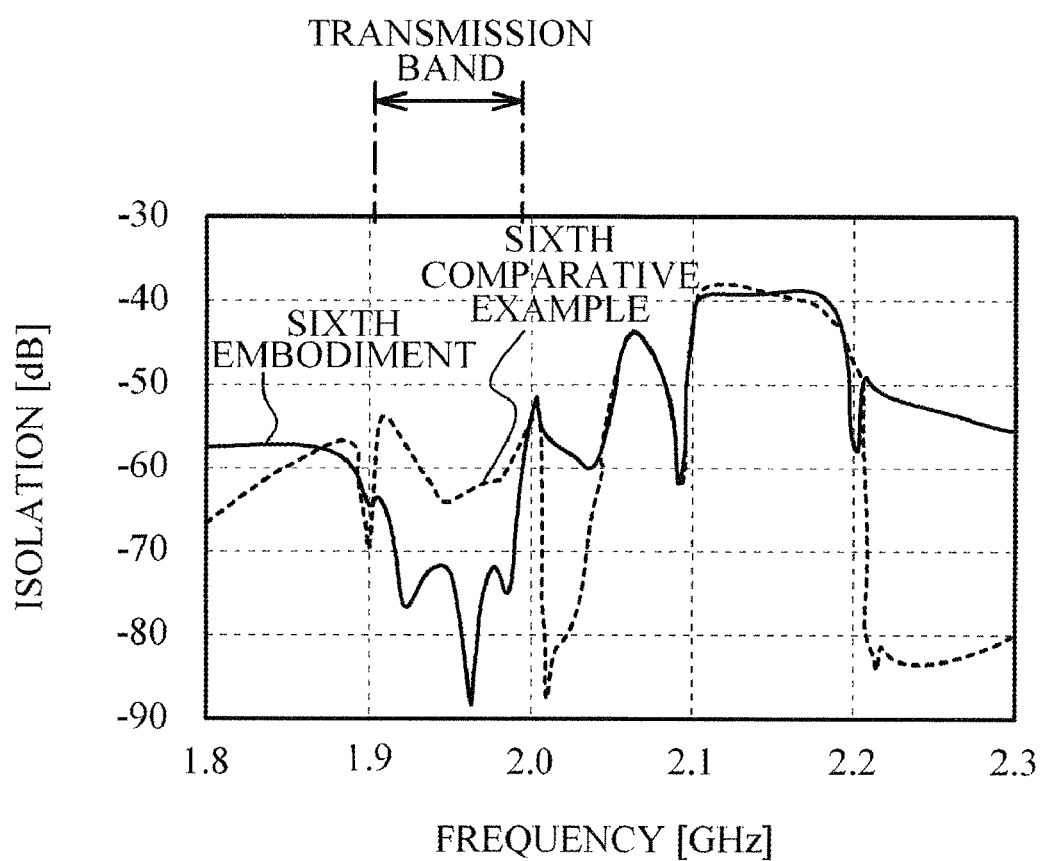
FIG. 17 is a diagram illustrating the isolation characteristics of the sixth embodiment and the sixth comparative example.

FIG. 16A and FIG. 16B are diagrams illustrating the passing characteristics of the receive filter 20 and the transmit filter 10 respectively, in the same ways as FIG. 4A and FIG. 4B. FIG. 17 is a diagram illustrating the frequency characteristics of the isolation from the transmission terminal to the reception terminal in the same way as FIG. 5. The sixth embodiment is illustrated in full line, and the sixth comparative example is illustrated in dash line. As illustrated in FIG. 16A, in the transmission band of the receive filter, the attenuation of the sixth embodiment is greater than that of the sixth comparative example. As illustrated in FIG. 16B, the passing characteristics of the transmit filter 10 of the sixth embodiment and the sixth comparative example are almost same. As illustrated in FIG. 17, in the sixth embodiment, the isolation in the transmission band is improved more than 10 dB compared to the sixth comparative example. As described above, the isolation characteristics are improved with the sixth embodiment.

In the sixth embodiment, the reception terminal Rx is capacitively coupled to the two terminals, which are the common terminal Ant and the transmission terminal Tx. There is a small phase difference between the transmission signal of the transmission terminal Tx and the transmission signal of the common terminal Ant. This is because a phase shift takes place in the transmission signal passing through the transmit filter 10 and the matching circuit 80. There is a small phase difference between the transmission signal from the transmission terminal Tx to the reception terminal Rx via the capacitors 42 and the transmission signal from the common terminal Ant to the reception terminal Rx via the capacitor 40. As mentioned above, canceling the transmission signal leaking from the receive filter 20 with the two signals having a small phase difference enables to improve the isolation characteristics for the transmission signal of which phase width is wide. Therefore, it becomes possible to improve the isolation characteristics in the whole transmission band.

One of the capacitors 40 and 42 in the sixth embodiment may be the capacitance described in the first to fourth embodiments. Additionally, all of the capacitors 40 and 42 may be the capacitors described in the first to fourth embodiments. Accordingly, the downsizing, the cost reduction, and the higher precision of the duplexer become possible.

Seventh Embodiment

Figure 18:
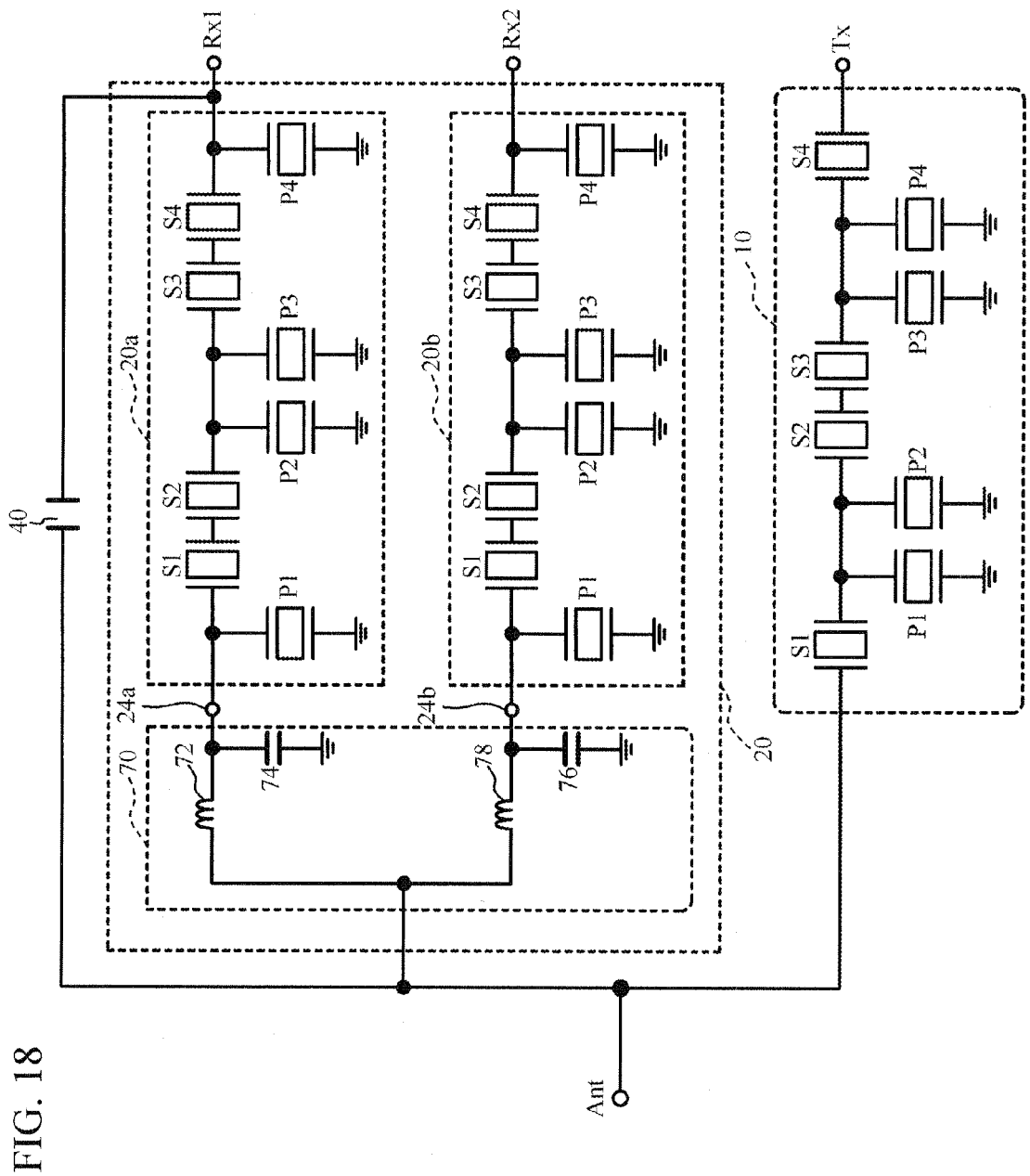
FIG. 18 is a diagram illustrating the circuit configuration of the duplexer in accordance with a seventh embodiment.

The seventh embodiment is an example that the reception terminal is an unbalance terminal. FIG. 18 is a diagram illustrating the circuit configuration of the duplexer in accordance with the seventh embodiment. As illustrated in FIG. 18, the receive filter 20 includes a balun 70 and two filters 20a and 20b. The balun 70 includes inductors 72 and 76, and capacitors 74 and 78. In between the common terminal Ant and an output terminal 24a, the inductor 72 is connected in series and the capacitor 74 is connected in parallel. In between the common terminal Ant and an output terminal 24b, the capacitor 78 is connected in series, and the inductor 76 is connected in parallel. The balun 70 delays the phase of the signal inputted to the common terminal Ant by about 90 degrees and outputs it to the output terminal 24a, and forwards the phase of the signal inputted to the common terminal Ant by about 90 degrees and outputs it to the output terminal 24b. As mentioned above, the balun 70 executes an unbalance-balance conversion.

The filter 20a is connected between the output terminal 24a of the balun 70 and the reception terminal Rx1, and the filter 20b is connected between the output terminal 24b and the reception terminal Rx2. Each of the filters 20a and 20b is the ladder type filter including the series resonators S1 to S4 and the parallel resonators P1 to P4. By making the phase shifts of the filters 20a and 20b be almost same, the reception signal inputted to the common terminal Ant is balance-outputted from the reception terminals Rx1 and Rx2. The capacitor 40 is connected between the reception terminal Rx1 that is one of the balance reception terminals, and the common terminal Ant. The transmit filter 10 is a ladder type filter including the series resonators S1 to S4 and the parallel resonators P1 to P4.

The passing characteristics of the duplexer in the seventh embodiment are simulated. In the simulation, the inductances of the inductors 72 and 76 of the balun 70 are 5.7 nH, the capacitance values of the capacitors 74 and 78 are 1.15 pF, and the capacitance value of the capacitor 40 is 0.05 pF. In the seventh comparative example, the capacitor 40 is not installed.

Figure 19:
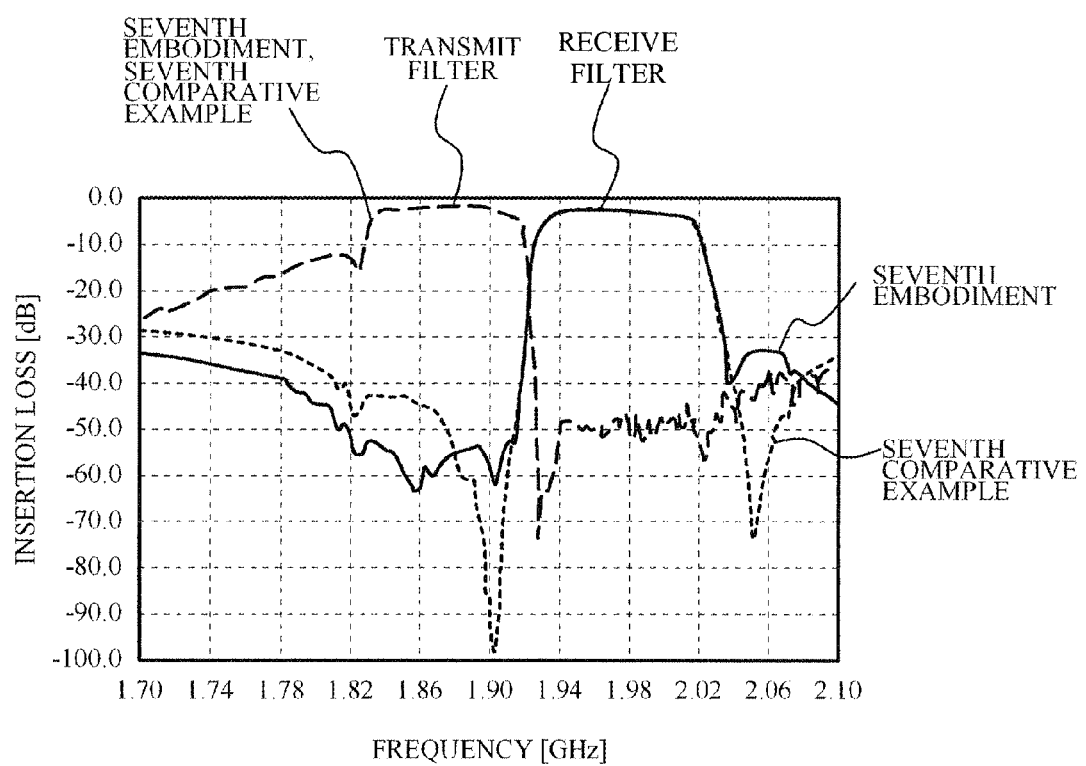
FIG. 19 is a diagram illustrating the passing characteristics of the seventh embodiment and a seventh comparative example.

FIG. 19 is a diagram illustrating the passing characteristics of the receive filter and the transmit filter of the seventh embodiment and the seventh comparative example. It should be noted that the characteristics of the receive filter 20 are the characteristics after the balun synthesis of the signal outputted to the reception terminals Rx1 and Rx2. The seventh embodiment is illustrated in full line and the seventh comparative example is illustrated in dash line. The passing characteristics of the transmit filter 10 of the seventh embodiment and the seventh comparative example are almost same. Meanwhile, the suppression characteristics of the seventh embodiment are improved in the transmission band of the receive filter 20 compared to the seventh comparative example.

Figure 20:
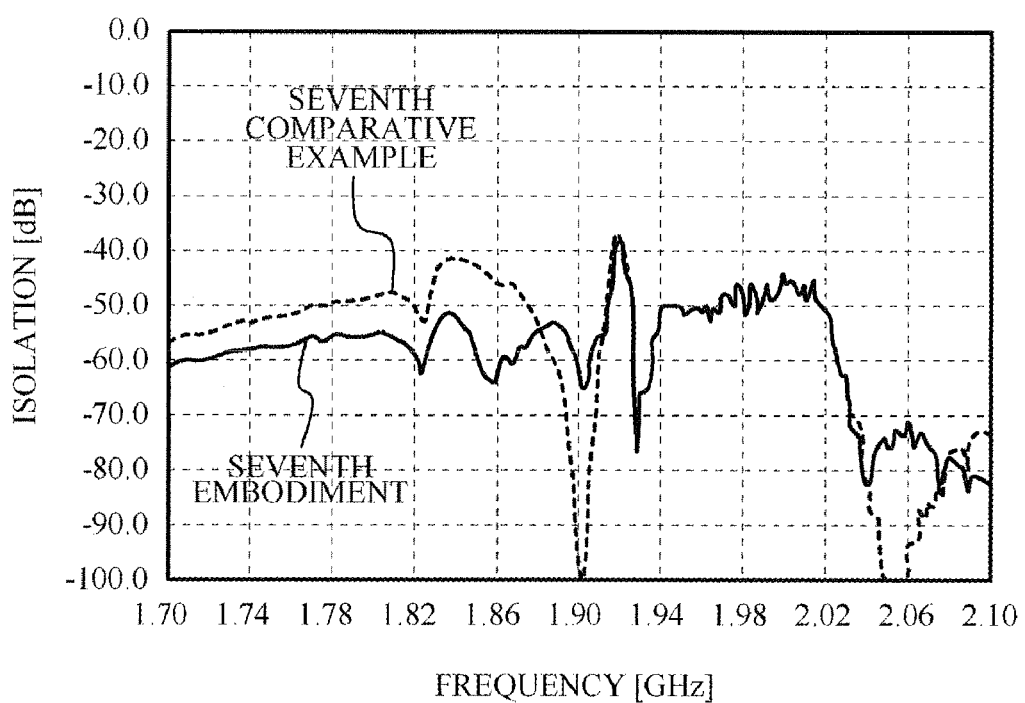
FIG. 20 is a diagram illustrating the isolation characteristics of the seventh embodiment and the seventh comparative example.

FIG. 20 illustrates the frequency characteristics of the isolation from the transmission terminal to the reception terminal. The isolation in the transmission band of the seventh embodiment is improved about 10 dB compared to the seventh comparative example.

According to the seventh embodiment, the receive filter 20 includes the balun 70, and the reception terminal Rx is a pair of the balance terminals. The capacitor 40 is connected to one of a pair of the balance terminals. Even though the phase shifting circuit in the first embodiment is not used, it is possible to make the transmission signal from the common terminal Ant to the reception terminal Rx1 via the balun 70 and the filter 20a, and the transmission signal from the common terminal Ant to the reception terminal Rx1 via the capacitor 40 have opposite phases with each other, because the balun 70 shifts the phase. Therefore, the phase shifting circuit described in the first embodiment becomes unnecessary. The transmit filter 10 may include balun and the transmission terminal Tx may be the balance terminal.

Eighth Embodiment

Figure 21:
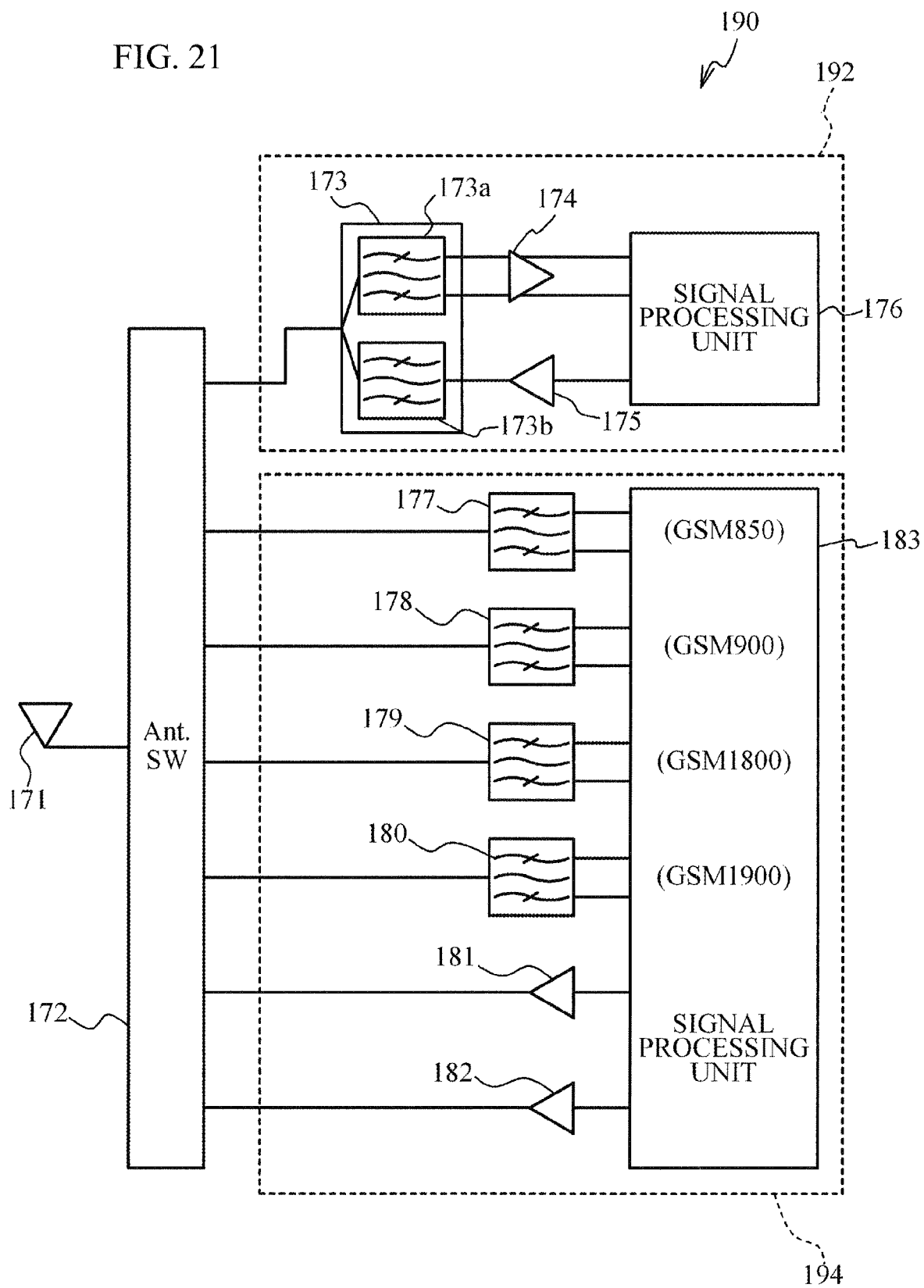
FIG. 21 is a block diagram of the mobile phone unit in accordance with an eighth embodiment.

The eighth embodiment is an example of the mobile phone unit as an electronic apparatus using the duplexer of any of the first to seventh embodiments. FIG. 21 is a block diagram illustrating mainly an RF (Radio Frequency) unit of a mobile phone unit 190 in accordance with the eighth embodiment. The mobile phone unit 190 supports GSM (Global System for Mobile Communication) and W-CDMA. The mobile phone unit 190 supports 850 MHz band (GSM850), 900 MHz band (GSM900), 1800 MHz band (GSM1800), and 1900 MHz band (GSM1900) in GSM. An antenna 171 transmits and receives transmission and reception signals both of GSM and W-CDMA. An antenna switch 172 selects a W-CDMA unit 192 for transmitting and receiving the W-CDMA method signal, and couples the W-CDMA unit 192 and the antenna 171. The antenna switch 172 selects a GSM unit 194 for transmitting and receiving the GSM method signal, and couples the GSM unit 194 and the antenna 171.

The W-CDMA unit 192 includes a duplexer 173, a low noise amplifier 174, a power amplifier 175 and a signal processing unit 176. The signal processing unit 176 generates a W-CDMA transmission signal. The power amplifier 175 amplifies the transmission signal. A receive filter 173a of the duplexer 173 passes the transmission signal, and outputs it to the antenna switch 172. The receive filter 173 a passes the W-CDMA reception signal that the antenna switch 172 outputs, and outputs it to the low noise amplifier 174. The low noise amplifier 174 amplifies the reception signal. The signal processing unit 176 down-converts the reception signal, and outputs it to follow-on processing units.

The GSM unit 194 includes filters 177 to 180, power amplifiers 181 and 182, and a signal processing unit 183. The signal processing unit 183 generates the GSM transmission signal. When the signal is a signal of GSM850 or GSM900, the power amplifier 181 amplifies the transmission signal. When the signal is a signal of GSM1800 or GSM1900, the power amplifier 182 amplifies the transmission signal. The antenna switch 172 selects the power amplifier 181 or 182 based on the type of GSM signal. The antenna switch 172 selects the filter from the filters 177 to 180 based on GSM signal received from the antenna 171. The filters 177 to 180 filter the reception signal, and output it to the signal processing unit 183. The signal processing unit 183 down-converts the reception signal, and outputs it to follow-on processing units. In the eighth embodiment, the duplexer can be the duplexer described in the first to sixth embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various change, substitutions, and alterations could be made hereto without departing from the spirit and scope of the invention.

What is claimed is:

1. A duplexer comprising:
   a transmit filter connected between a common terminal and a transmission terminal;
   a receive filter connected between the common terminal and a reception terminal;
   a capacitor connected in parallel with one of the transmit filter and the receive filter and provided between two terminals of the common terminal, the transmission terminal, and the reception terminal; and
   a package including:
     an insulating layer;
     foot pads that include the common terminal, the transmission terminal and the reception terminal and are formed on one surface of the insulating layer; and
     interconnections formed on another surface opposite to the one surface of the insulating layer,
   wherein the capacitor includes two capacitor forming units that are connected in parallel with each other and are formed with at least one foot pad of the foot pads and two of the interconnections that overlap with two opposing sides of the at least one foot pad respectively.

2. The duplexer according to claim 1, wherein the capacitor includes another capacitor forming unit that is connected in parallel with the two capacitor forming units and is formed with the at least one foot pad and another interconnection that overlaps with another side that is different from the two sides.

3. The duplexer according to claim 1, wherein the capacitor includes other two capacitor forming units that are connected in parallel with the two capacitor forming units and are formed with the at least one foot pad and other two interconnections that overlap with other two opposing sides that are different from the two sides.

4. The duplexer according to claim 1, wherein the two capacitor forming units have widths that are equal to each other.

5. The duplexer according to claim 1, further comprising a phase shifting circuit that is connected in series with one of the transmit filter and the receive filter and shifts a phase of a signal in a pass band of the other one of the transmit filter and the receive filter.

6. The duplexer according to claim 1, wherein a signal transmitted from one of the two terminals to another via the capacitor and a signal transmitted from one of the two terminals to another via the transmit filter or the receive filter have opposite phases.

7. The duplexer according to claim 1, wherein the capacitor is connected between the reception terminal, and at least one of the common terminal and the transmission terminal.

8. The duplexer according to claim 1, wherein the capacitor is connected between the reception terminal and the common terminal, and another capacitor is connected between the reception terminal and the transmission terminal, respectively.

9. The duplexer according to claim 1, wherein one of the receive filter and the transmit filter includes a balun, one of the reception terminal and the transmission terminal includes a pair of balance terminals, and the capacitor is connected to one of the pair of balance terminals.

10. A duplexer comprising:
    a transmit filter connected between a common terminal and a transmission terminal;
    a receive filter connected between the common terminal and a reception terminal;
    a capacitor connected in parallel with one of the transmit filter and the receive filter and provided between two terminals of the common terminal, the transmission terminal, and the reception terminal;
    an insulating layer;
    foot pads that include the common terminal, the transmission terminal and the reception terminal and are formed on one surface of the insulating layer; and
    an interconnection formed on another surface opposite to the one surface of the insulating layer,
    wherein:
    the capacitor includes a capacitor forming unit formed with at least one foot pad of the foot pads and the interconnection formed to be included in an area where the at least one foot pad is formed; and
    an area of the interconnection is smaller than an area of the at least one foot pad.

11. The duplexer according to claim 10, wherein the interconnection includes a circular shape.

12. The duplexer according to claim 10, further comprising:
- another insulating layer provided on said another surface of the insulating layer;
- a via material that connects the interconnection and another interconnection formed on a surface of said another insulating layer opposite to said another surface of the insulating layer.

13. A substrate for a duplexer comprising:
- an insulating layer;
- a mounting unit that mounts a transmit filter connected between a common terminal and a transmission terminal, and a receive filter connected between the common terminal and a reception terminal;
- a capacitor connected in parallel with one of the transmit filter and the receive filter and provided between two terminals of the common terminal, the transmission terminal, and the reception terminal;
- foot pads that include the common terminal, the transmission terminal and the reception terminal and are formed on one surface of the insulating layer; and
- interconnections formed on another surface opposite to the one surface of the insulating layer,
- wherein the capacitor includes two capacitor forming units that are formed with at least one foot pad of the foot pads and two of the interconnections that overlap with two opposing sides of the at least one foot pad, and are connected in parallel with each other.

14. A substrate for a duplexer comprising:
- an insulating layer;
- a mounting unit that mounts a transmit filter connected between a common terminal and a transmission terminal, and a receive filter connected between the common terminal and a reception terminal;
- a capacitor connected in parallel with one of the transmit filter and the receive filter and provided between two terminals of the common terminal, the transmission terminal and the reception terminal;
- foot pads that include the common terminal, the transmission terminal, and the reception terminal and are formed on one surface of the insulating layer; and
- an interconnection formed on another surface opposite to the one surface of the insulating layer,
wherein:
the capacitor includes a capacitor forming unit formed with at least one foot pad and the interconnection formed to be included in an area where the at least one foot pad is formed; and
an area of the interconnection is smaller than an area of the at least one foot pad.

15. An electronic apparatus including a duplexer, the duplexer comprising:
- a transmit filter connected between a common terminal and a transmission terminal;
- a receive filter connected between the common terminal and a reception terminal;
- a capacitor connected in parallel with one of the transmit filter and the receive filter and provided between two terminals of the common terminal, the transmission terminal, and the reception terminal; and
- a package including:
  - an insulating layer;
  - foot pads that include the common terminal, the transmission terminal and the reception terminal and are formed on one surface of the insulating layer; and
  - interconnections formed on another surface opposite to the one surface of the insulating layer,
- wherein the capacitor includes two capacitor forming units that are connected in parallel with each other and are formed with at least one foot pad of the foot pads and two of the interconnections that overlap with two opposing sides of the at least one foot pad respectively.

* * * * *